(12) United States Patent
Morita

(10) Patent No.: US 9,792,872 B2
(45) Date of Patent: Oct. 17, 2017

(54) ELECTRO-OPTICAL PANEL HAVING A DRIVER WITH VARIABLE DRIVING CAPABILITY

(71) Applicant: SEIKO EPSON CORPORATION, Tokyo (JP)

(72) Inventor: Akira Morita, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 28 days.

(21) Appl. No.: 14/953,767

(22) Filed: Nov. 30, 2015

(65) Prior Publication Data

US 2016/0163284 A1 Jun. 9, 2016

(30) Foreign Application Priority Data

Dec. 5, 2014 (JP) ................. 2014-246531

(51) Int. Cl.
| | | |
|---|---|---|
| *G06F 3/038* | (2013.01) | |
| *G09G 5/00* | (2006.01) | |
| *G09G 3/36* | (2006.01) | |
| *H03M 1/08* | (2006.01) | |
| *G09G 3/20* | (2006.01) | |
| *H03M 1/70* | (2006.01) | |

(52) U.S. Cl.
CPC ........ *G09G 3/3688* (2013.01); *H03M 1/0863* (2013.01); *G09G 3/20* (2013.01); *G09G 2310/027* (2013.01); *G09G 2310/0251* (2013.01); *G09G 2310/0297* (2013.01); *G09G 2330/06* (2013.01); *H03M 1/70* (2013.01)

(58) Field of Classification Search
CPC .................................................. G09G 3/3688
USPC ..................................................... 345/215, 89
See application file for complete search history.

(56) References Cited

U.S. PATENT DOCUMENTS

| | | | |
|---|---|---|---|
| 6,420,988 B1 | 7/2002 | Azami et al. | |
| 6,486,812 B1 | 11/2002 | Tanaka | |
| 6,606,045 B2 | 8/2003 | Azami et al. | |
| 8,400,439 B2 | 3/2013 | Morita | |
| 2002/0003521 A1* | 1/2002 | Matsueda ............ | G09G 3/2011 345/89 |
| 2002/0060636 A1* | 5/2002 | Kazuhiro ............. | G09G 3/3688 341/150 |
| 2005/0206598 A1* | 9/2005 | Yamazaki ............ | G09G 3/3648 345/87 |
| 2014/0070973 A1* | 3/2014 | Chiu .................... | H03D 7/1491 341/150 |
| 2015/0049073 A1 | 2/2015 | Morita | |

FOREIGN PATENT DOCUMENTS

| | | |
|---|---|---|
| JP | 2000-341125 A | 12/2000 |
| JP | 2001-156641 A | 6/2001 |

(Continued)

*Primary Examiner* — Long D Pham
(74) *Attorney, Agent, or Firm* — Oliff PLC

(57) ABSTRACT

A driver and an electronic device include a capacitor driving circuit and a capacitor circuit having a plurality of capacitors provided between a plurality of capacitor driving nodes and a data voltage output terminal, and the capacitor driving circuit includes a plurality of driving units that output capacitor driving voltages. In the case where the capacitor that has the highest capacitance among the plurality of capacitors is driven, the driving unit that drives that highest capacitor is a driving unit whose driving capability is variable.

12 Claims, 19 Drawing Sheets

(56) References Cited

FOREIGN PATENT DOCUMENTS

| | | |
|---|---|---|
| JP | 2010-102080 A | 5/2010 |
| JP | 2010-181506 A | 8/2010 |
| JP | 2015-036757 A | 2/2015 |
| JP | 2015-038543 A | 2/2015 |

* cited by examiner

DR8~DR10

DR1~DR7

(COMPARATIVE EXAMPLE)

| CAPACITOR | CAPACITANCE [pF] | BUFFER DRIVING CAPABILITY | | |
| --- | --- | --- | --- | --- |
| | | Pch W[um] | Nch W[um] | D/C NchW [um]/ CAPACITANCE [pF] |
| C10 | 32 | 9216 | 3072 | 96 |
| C9 | 16 | 4608 | 1536 | 96 |
| C8 | 8 | 2304 | 768 | 96 |
| C7 | 4 | 1152 | 384 | 96 |
| C6 | 2 | 576 | 192 | 96 |
| C5 | 1 | 288 | 96 | 96 |
| C4 | 0.5 | 144 | 48 | 96 |
| C3 | 0.25 | 72 | 24 | 96 |
| C2 | 0.125 | 36 | 12 | 96 |
| C1 | 0.0625 | 18 | 6 | 96 |

FIG. 6

|  | BUFFER DRIVING CAPABILITY 1 | | |
| --- | --- | --- | --- |
|  | Pch | Nch | D/C |
| CAPACITOR | CAPACITANCE [pF] | W[um] | W[um] | NchW [um]/ CAPACITANCE [pF] |
| C10 | 32 | 600 | 200 | 6.25 |
| C9 | 16 | 300 | 100 | 6.25 |
| C8 | 8 | 150 | 50 | 6.25 |
| C7 | 4 | 75 | 25 | 6.25 |
| C6 | 2 | 37.5 | 12.5 | 6.25 |
| C5 | 1 | 20 | 6.25 | 6.25 |
| C4 | 0.5 | 18 | 6 | 12 |
| C3 | 0.25 | 18 | 6 | 24 |
| C2 | 0.125 | 18 | 6 | 48 |
| C1 | 0.0625 | 18 | 6 | 96 |

FIG. 7A

|  | BUFFER DRIVING CAPABILITY 2 | | |
| --- | --- | --- | --- |
|  | Pch | Nch | D/C |
| CAPACITOR | CAPACITANCE [pF] | W[um] | W[um] | NchW [um]/ CAPACITANCE [pF] |
| C10 | 32 | 300 | 100 | 3.125 |
| C9 | 16 | 150 | 50 | 3.125 |
| C8 | 8 | 75 | 25 | 3.125 |
| C7 | 4 | 75 | 25 | 6.25 |
| C6 | 2 | 37.5 | 12.5 | 6.25 |
| C5 | 1 | 20 | 6.25 | 6.25 |
| C4 | 0.5 | 18 | 6 | 12 |
| C3 | 0.25 | 18 | 6 | 24 |
| C2 | 0.125 | 18 | 6 | 48 |
| C1 | 0.0625 | 18 | 6 | 96 |

FIG. 7B

FIG. 10A RESET
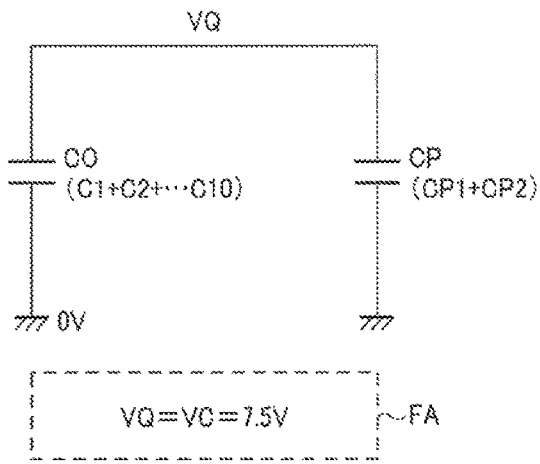
FIG. 10B MAXIMUM DATA VOLTAGE
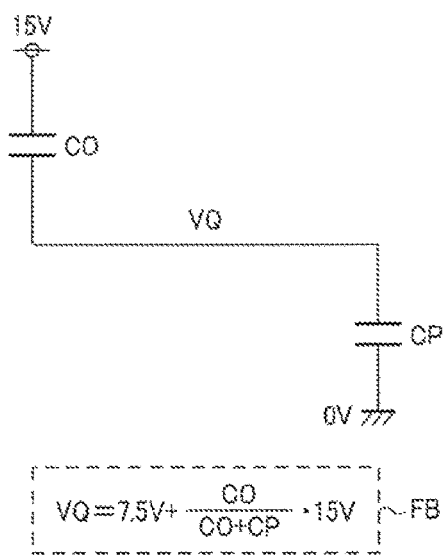
FIG. 10C
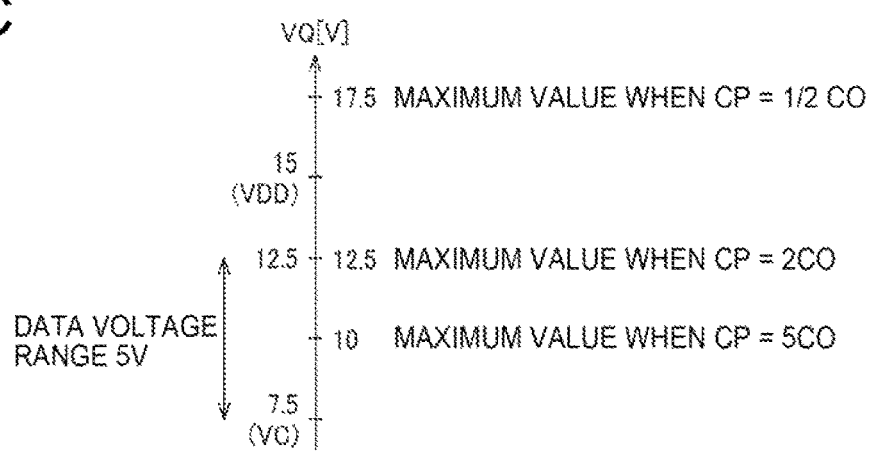

FIG. 12A RESET
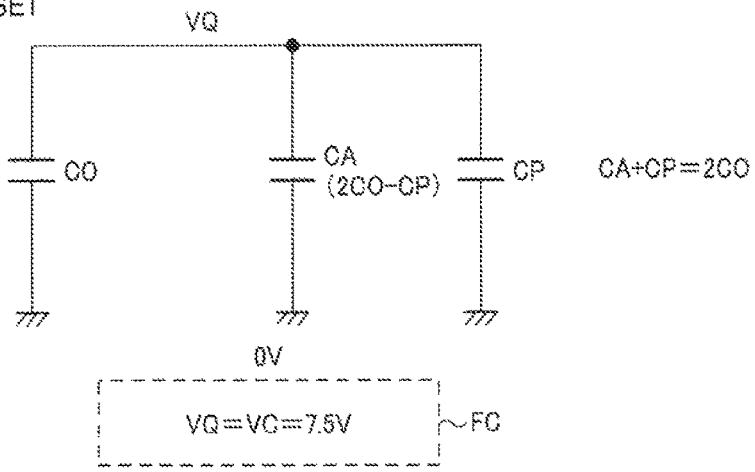
FIG. 12B MAXIMUM DATA VOLTAGE
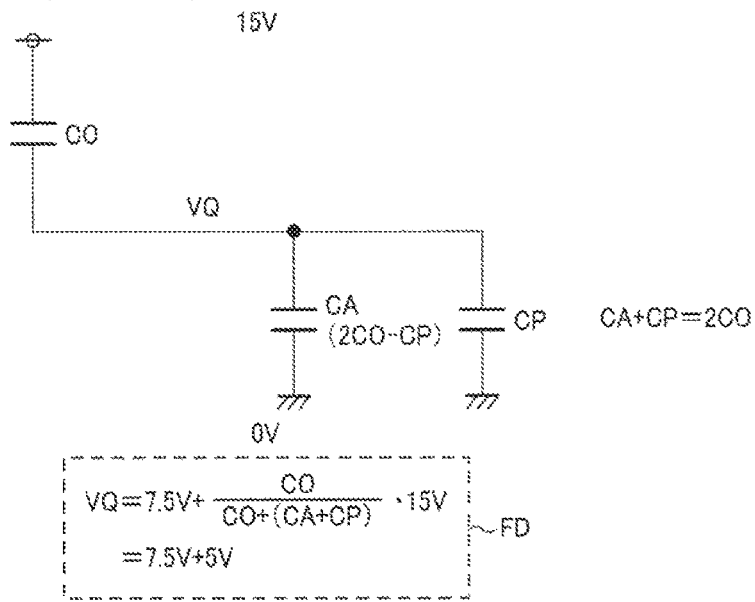
FIG. 12C
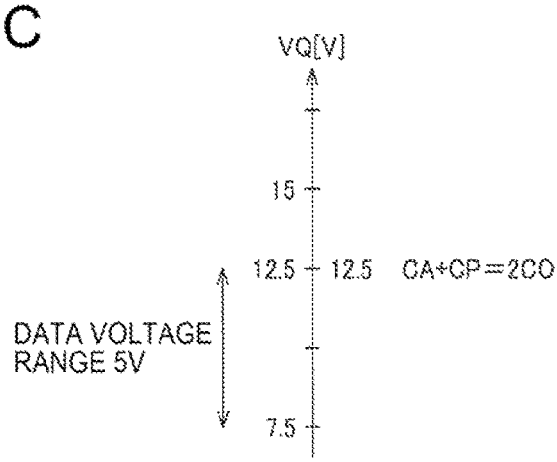

FIG. 16A (S8:NO)
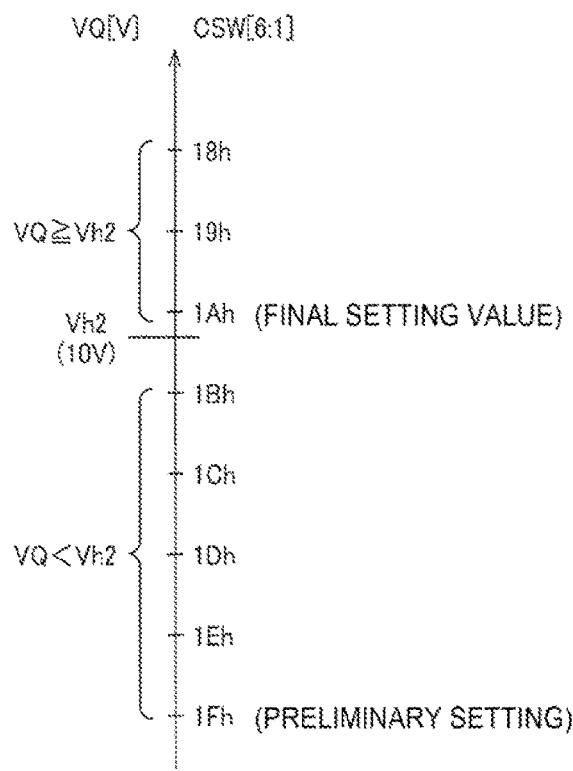
FIG. 16B (S8:YES)
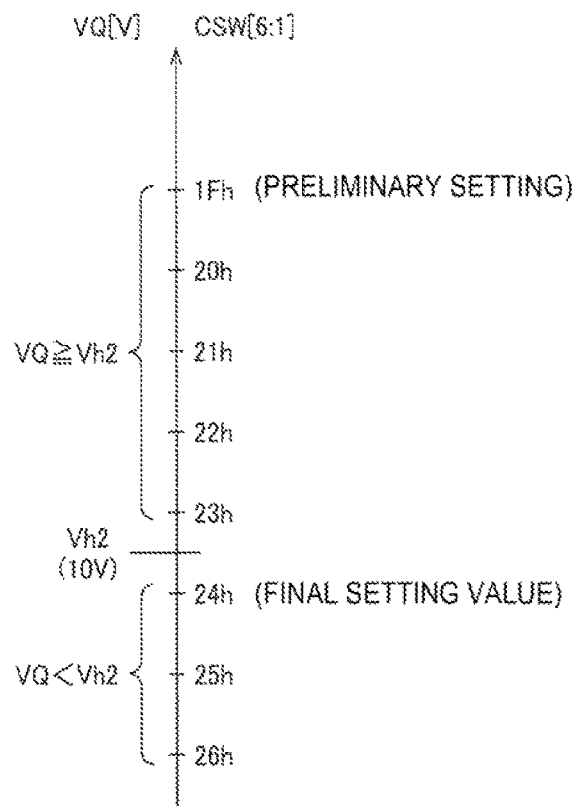

ELECTRO-OPTICAL PANEL HAVING A DRIVER WITH VARIABLE DRIVING CAPABILITY

BACKGROUND

1. Technical Field

The present invention relates to drivers, electronic devices, and the like.

2. Related Art

Display devices (liquid-crystal display devices, for example) are used in a variety of electronic devices, including projectors, information processing apparatuses, mobile information terminals, and the like. Increases in the resolutions of such display devices continue to progress, and as a result, the time a driver drives a single pixel is becoming shorter. For example, phase expansion driving is used as a method for driving an electro-optical panel (a liquid-crystal display panel, for example). According to this driving method, for example, eight source lines are driven at one time, and the process is repeated 160 times to drive 1,280 source lines. In the case where a WXGA (1,280×768 pixels) panel is to be driven, the stated 160 instances of driving (that is, the driving of a single horizontal scanning line) is thus repeated 768 times. Assuming a refresh rate of 60 Hz, a simple calculation shows that the driving time for a single pixel is approximately 135 nanoseconds. In actuality, there are periods where pixels are not driven (blanking intervals and the like, for example), and thus the driving time for a single pixel becomes even shorter, at approximately 70 nanoseconds.

With the shortening of pixel driving times as mentioned above, it is becoming difficult for amplifier circuits to finish writing data voltages within the required time. A method that drives an electro-optical panel through capacitor charge redistribution (called "capacitive driving" hereinafter) can be considered as a driving method for solving such problems. For example, JP-A-2000-341125 and JP-A-2001-156641 disclose techniques that use capacitor charge redistribution in D/A conversion. In a D/A conversion circuit, both driving-side capacitance and load-side capacitance are included in an IC, and charge redistribution occurs between those capacitances. For example, assume such a load-side capacitance of the D/A conversion circuit is replaced with the capacitance of the electro-optical panel external to the IC and the D/A conversion circuit is used as a driver. In this case, charge redistribution occurs between the driver-side capacitance and the electro-optical panel-side capacitance.

However, there is a problem in that a resistance of an input terminal of the electro-optical panel (a resistance for electrostatic protection, for example) interferes with the movement of charges, resulting in a voltage at an output terminal of the driver temporarily rising above (or falling below) a desired data voltage. In the case where this voltage rise (or fall) exceeds (or falls below) a power source voltage, for example, the charge will escape to the power source via an electrostatic protection element of the driver (a diode provided between the output terminal and the power source, for example), and the charge in the charge redistribution will no longer be conserved. When this occurs, the desired data voltage can no longer be obtained. Alternatively, the rise (or fall) in the voltage will exceed the breakdown voltage of a transistor or the like, which may cause the driver to malfunction.

SUMMARY

An advantage of some aspects of the invention is to provide a driver, an electronic device, and so on capable of suppressing a rise (or fall) in a voltage at an output terminal in capacitive driving.

A first aspect of the invention relates to a driver including a capacitor driving circuit that outputs first to nth capacitor driving voltages (where n is a natural number of 2 or more) corresponding to tone data to first to nth capacitor driving nodes, and a capacitor circuit including first to nth capacitors provided between the first to nth capacitor driving nodes and a data voltage output terminal. The capacitor driving circuit includes first to nth driving units that output the first to nth capacitor driving voltages, and in the case where a capacitance of the nth capacitor is the highest among the first to nth capacitors, at least the nth driving unit of the first to nth driving units is a driving unit whose driving capability is variable.

According to this aspect of the invention, the driving capability of the nth driving unit, which drives the nth capacitor whose capacitance is the highest among the first to nth capacitors, can be adjusted in a variable manner. This makes it possible to reduce the driving capability of the nth driving unit that drives the nth capacitor having the highest capacitance, which in turn makes it possible to suppress a rise (or fall) in a voltage at an output terminal in capacitive driving.

According to another aspect of the invention, in the case where driving capabilities of the first to nth driving units are represented by D1 to Dn and capacitances of the first to nth capacitors are represented by C1 to Cn, the driving capability Dn of the nth driving unit may be set so that Dn/Cn<D1/C1.

By setting the driving capability Dn of the nth driving unit so that Dn/Cn<D1/C1, a slope of a change in the nth capacitor driving voltage that drives the nth capacitor, whose charge supply amount to the data voltage output terminal is the highest, can be made lower than a slope of a change in the first capacitor driving voltage that drives the first capacitor. Through this, a rise (or fall) in a voltage at an output terminal in capacitive driving can be suppressed.

According to another aspect of the invention, the driver may further include a storage unit that stores a setting value for the driving capability of the driving unit whose driving capability is variable.

By doing so, the driving capabilities can be set in a variable manner based on the setting values stored in the storage unit. For example, by storing, in the storage unit, setting values for the driving capabilities based on the type of an electro-optical panel connected to the driver, the optimal driving capabilities (that is, that reduce a voltage peak while maintaining high-speed settling in capacitive driving) for the type of the electro-optical panel can be selected.

Another aspect of the invention relates to a driver including a capacitor driving circuit that outputs first to nth capacitor driving voltages (where n is a natural number of 2 or more) corresponding to tone data to first to nth capacitor driving nodes, and a capacitor circuit including first to nth capacitors provided between the first to nth capacitor driving nodes and a data voltage output terminal. The capacitor driving circuit includes first to nth driving units that output the first to nth capacitor driving voltages, and in the case where driving capabilities of the first to nth driving units are represented by D1 to Dn and capacitances of the first to nth capacitors are represented by C1 to Cn, the driving capability Dn of the nth driving unit is set so that Dn/Cn<D1/C1.

According to this other aspect of the invention, by setting the driving capability Dn of the nth driving unit so that Dn/Cn<D1/C1, a slope of a change in the nth capacitor driving voltage that drives the nth capacitor, whose charge supply amount to the data voltage output terminal is the highest, can be made lower than a slope of a change in the first capacitor driving voltage that drives the first capacitor. Through this, a rise (or fall) in a voltage at an output terminal in capacitive driving can be suppressed.

According to the first aspect and the other aspect of the invention, jth to nth driving units of the first to nth driving units (where j is a natural number of 1≤j≤n) may be driving units whose driving capabilities are variable, and first to j−1th driving units of the first to nth driving units may be driving units whose driving capabilities are fixed.

Of the first to nth capacitors, the jth to nth capacitors, which correspond to the most significant bit side of the tone data, have higher capacitances. By making it possible to set the driving capabilities of the jth to nth driving units, which drive the jth to nth capacitors, to be variable, the driving capabilities on the most significant bit side, which have greater influence on the peak value of the voltage at the data voltage output terminal, can be reduced.

According to the first aspect and the other aspect of the invention, in the case where driving capabilities of the first to nth driving units are represented by D1 to Dn and capacitances of the first to nth capacitors are represented by C1 to Cn, the driving capabilities of the jth to nth driving units may be set so that Di/Ci<D1/C1 (where i is a natural number of j≤i≤n).

By doing so, a slope of changes in the jth to nth capacitor driving voltages that drive the jth to nth capacitors, which corresponds to the most significant bit side of the tone data and whose capacitances are the highest, can be made lower than a slope of a change in the first capacitor driving voltage that drives the first capacitor, whose capacitance is the lowest. Through this, the speed of charge supplies (that is, currents) from the jth to nth capacitors, whose charge supply amounts to the data voltage output terminal are high, can be reduced.

According to the first aspect and the other aspect of the invention, the driver may further include a storage unit that stores a setting value for the driving capability of the driving unit whose driving capability is variable.

By doing so, the driving capabilities can be set in a variable manner based on the setting values stored in the storage unit. For example, by storing, in the storage unit, setting values for the driving capabilities based on the type of an electro-optical panel connected to the driver, the optimal driving capabilities (that is, that reduce a voltage peak while maintaining high-speed settling in capacitive driving) for the type of the electro-optical panel can be selected.

According to another aspect of the invention, the driver may further include a variable capacitance circuit provided between the data voltage output terminal and a reference voltage node; and a capacitance of the variable capacitance circuit may be set so that a capacitance obtained by adding a capacitance of the variable capacitance circuit and an electro-optical panel-side capacitance is in a prescribed capacitance ratio relationship with a capacitance of the capacitor circuit.

Accordingly, even if the electro-optical panel-side capacitance is different, the prescribed capacitance ratio relationship can be realized by adjusting the capacitance of the variable capacitance circuit in accordance therewith, and a desired data voltage range that corresponds to that capacitance ratio relationship can be realized. In other words, capacitive driving that is generally applicable in a variety of connection environments (the type of the electro-optical panel connected to the driver, the design of a printed circuit board on which the driver is mounted, and so on, for example) can be realized.

Another aspect of the invention relates to an electronic device including any of the drivers described above.

BRIEF DESCRIPTION OF THE DRAWINGS

The invention will be described with reference to the accompanying drawings, wherein like numbers reference like elements.

FIG. 6 is a comparative example indicating driving capability of a driving unit.

FIGS. 7A and 7B illustrate examples of the driving capabilities of driving units according to an embodiment.

FIGS. 10A to 10C are diagrams illustrating data voltages in the first configuration example.

FIGS. 12A to 12C are diagrams illustrating data voltages in the second example.

FIGS. 16A and 16B are diagrams illustrating a process for setting a capacitance of a variable capacitance circuit.

DESCRIPTION OF EXEMPLARY EMBODIMENTS

Hereinafter, preferred embodiments of the invention will be described in detail. Note that the embodiments described hereinafter are not intended to limit the content of the invention as described in the appended claims in any way, and not all of the configurations described in these embodiments are required as the means to solve the problems as described above.

1. First Example of Configuration of Driver

Figure 1:
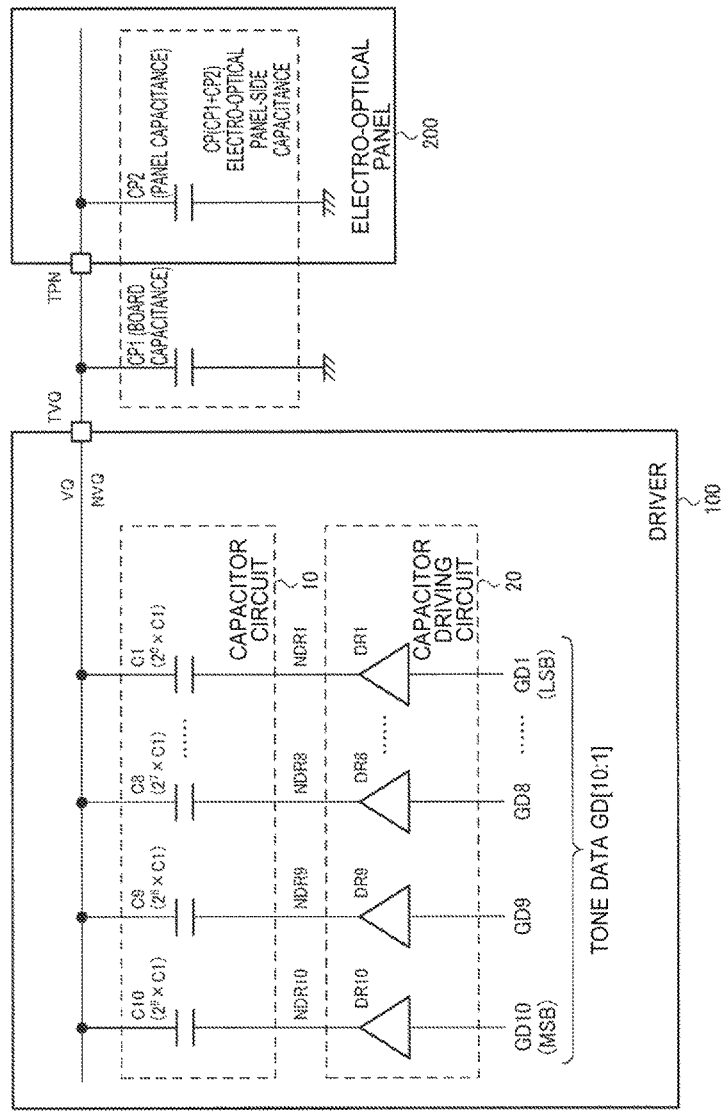
FIG. 1 illustrates a first example of the configuration of a driver.

FIG. 1 illustrates a first example of the configuration of a driver according to this embodiment. This driver 100 includes a capacitor circuit 10, a capacitor driving circuit 20, and a data voltage output terminal TVQ. Note that in the following, the same sign as a sign for a capacitor is used as a sign indicating a capacitance value of that capacitor.

The driver 100 is constituted by an integrated circuit (IC) device, for example. The integrated circuit device corresponds to an IC chip in which a circuit is formed on a silicon substrate, or a device in which an IC chip is held in a package, for example. Terminals of the driver 100 (the data voltage output terminal TVQ and so on) correspond to pads or package terminals of the IC chip.

The capacitor circuit 10 includes first to nth capacitors C1 to Cn (where n is a natural number of 2 or more). The capacitor driving circuit 20 includes first to nth driving units DR1 to DRn. Although the following describes a case where n=10 as an example, n may be any natural number greater than or equal to 2. For example, n may be set to the same number as the bit number of tone data.

One end of an ith capacitor in the capacitors C1 to C10 (where i is a natural number no greater than n, which is 10) is connected to a capacitor driving node NDRi, and another end of the ith capacitor is connected to a data voltage output node NVQ. The data voltage output node NVQ is a node connected to the data voltage output terminal TVQ. The capacitors C1 to C10 have capacitance values weighted by a power of 2. Specifically, the capacitance value of the ith capacitor Ci is $2^{(i-1)} \times C1$.

An ith bit GDi of tone data GD[10:1] is inputted into an input node of an ith driving unit DRi of the first to tenth driving units DR1 to DR10. An output node of the ith driving unit DRi corresponds to the ith capacitor driving node NDRi. The tone data GD[10:1] is constituted of first to tenth bits GD1 to GD10 (first to nth bits), where the bit GD1 corresponds to the LSB and the bit GD10 corresponds to the MSB.

The ith driving unit DRi outputs a first voltage level in the case where the bit GDi is at a first logic level and outputs a second voltage level in the case where the bit GDi is at a second logic level. For example, the first logic level is 0 (low-level), the second logic level is 1 (high-level), the first voltage level is a voltage at a low-potential side power source VSS (0 V, for example), and the second voltage level is a voltage at a high-potential side power source VDD (15 V, for example). For example, the ith driving unit DRi is constituted of a level shifter that level-shifts the inputted logic level (a 3 V logic power source, for example) to the output voltage level (15 V, for example) of the driving unit DRi, a buffer circuit that buffers the output of that level shifter, and so on.

As described above, the capacitance values of the capacitors C1 to C10 are weighted by a power of 2 that is based on the order of the bits GD1 to GD10 in the tone data GD[10:1]. The driving units DR1 to DR10 output 0 V or 15 V in accordance with the bits GD1 to GD10, and the capacitors C1 to C10 are driven by those voltages. As a result of this driving, charge redistribution occurs between the capacitors C1 to C10 and an electro-optical panel-side capacitance CP, and a data voltage is output to the data voltage output terminal TVQ as a result.

The electro-optical panel-side capacitance CP is the sum of capacitances as viewed from the data voltage output terminal TVQ. For example, the electro-optical panel-side capacitance CP is a result of adding a board capacitance CP1 that is parasitic capacitance of a printed circuit board with a panel capacitance CP2 that is parasitic capacitance, pixel capacitances, and the like within an electro-optical panel 200.

Specifically, the driver 100 is mounted on a rigid board as an integrated circuit device, a flexible board is connected to that rigid board, and the electro-optical panel 200 is connected to that flexible board. Interconnects are provided on the rigid board and the flexible board for connecting the data voltage output terminal TVQ of the driver 100 to a data voltage input terminal TPN of the electro-optical panel 200. Parasitic capacitance of these interconnects corresponds to the board capacitance CP1. Meanwhile, as will be described later with reference to FIG. 17, data lines connected to the data voltage input terminal TPN, source lines, switching elements that connect the data lines to the source lines, pixel circuits connected to the source lines, and so on are provided in the electro-optical panel 200. The switching elements are constituted by TFTs (Thin Film Transistors), for example, and there is parasitic capacitance between the source and gate of each switching element. Many switching elements are connected to the data lines, and thus the parasitic capacitance of many switching elements is present on the data lines. Parasitic capacitance is also present between data lines, source lines, or the like and a panel substrate. In the liquid-crystal display panel, there is capacitance in the liquid-crystal pixels. The panel capacitance CP2 is the sum of those capacitances.

The electro-optical panel-side capacitance CP is 50 pF to 120 pF, for example. As will be described later, to ensure a ratio of 1:2 between a capacitance CO of the capacitor circuit 10 (the sum of the capacitances of the capacitors C1 to C10) and the electro-optical panel-side capacitance CP, the capacitance CO of the capacitor circuit 10 is 25 pF to 60 pF. Although large as a capacitance internal to an integrated circuit, the capacitance CO of the capacitor circuit 10 can be achieved by a cross-sectional structure that, for example, vertically stacks two to three levels of MIM (Metal Insulation Metal) capacitors.

2. Data Voltages

Next, data voltages outputted by the driver 100 with respect to the tone data GD[10:1] will be described. Here, it is assumed that the capacitance CO of the capacitor circuit 10 (=C1+C2+ . . . C10) is set to CP/2.

Figure 2A:
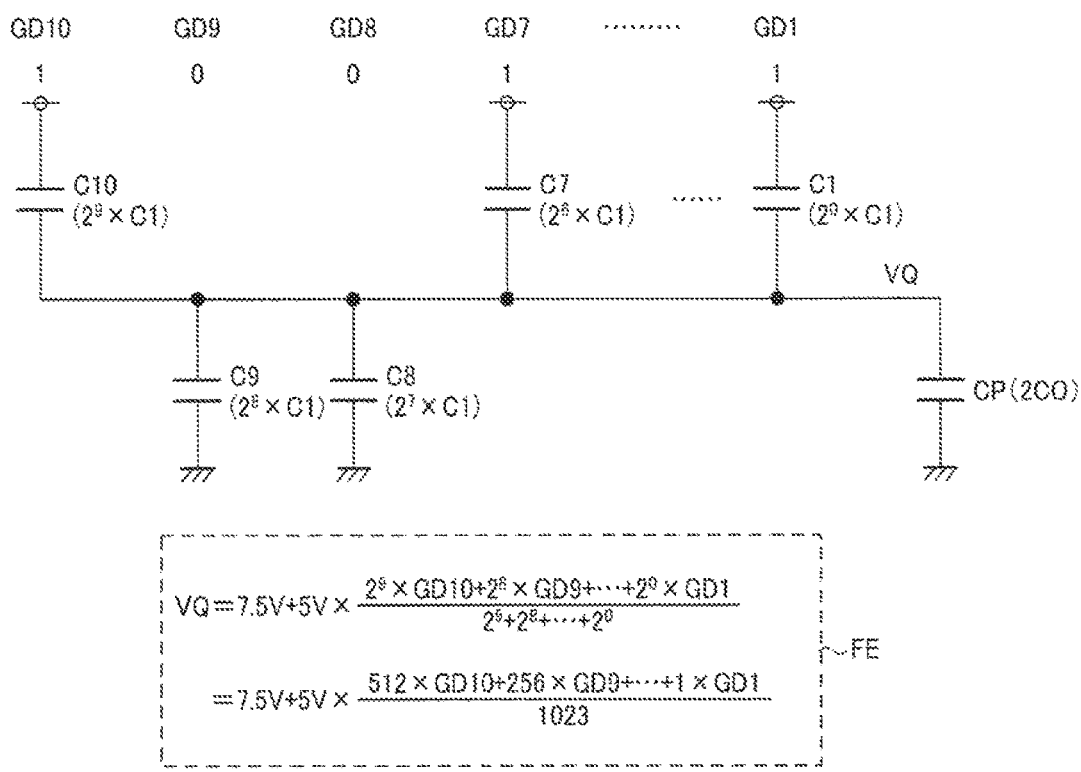
FIGS. 2A and 2B are diagrams illustrating data voltages corresponding to tone data.

As illustrated in FIG. 2A, the driving unit DRi outputs 0 V in the case where the ith bit GDi is "0", and the driving unit DRi outputs 15 V in the case where the ith bit GDi is "1". FIG. 2A illustrates an example of a case where GD[10:1]="1001111111b" (the b at the end indicates that the number within the "is binary").

First, a reset is carried out prior to driving. In other words, GD[10:1] is set to "0000000000b", 0 V is output to the driving units DR1 to DR10, and a voltage VQ is set to VC=7.5 V. VC=7.5 V corresponds to a reset voltage.

Figure 2B:
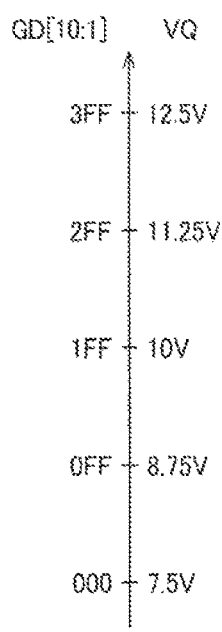

In this reset, a charge accumulated at the data voltage output node NVQ is also conserved in the driving carried out thereafter, and thus based on the principle of charge conservation, Formula FE in FIG. 2A is found. In Formula FE, the sign GDi expresses the value of the bit GDi ("0" or "1"). Looking at the second term on the right side of Formula FE, it can be seen that the tone data GD[10:1] is converted into 1,024-tone data voltages (5 V×0/1,023, 5 V×1/1,023, 5 V×2/1,023, . . . , 5 V×1,023/1,023). FIG. 2B illustrates a data voltage (the output voltage VQ) when the most significant three bits of the tone data GD[10:1] have been changed as an example.

Although positive-polarity driving has been described as an example thus far, it should be noted that negative-polarity driving may be carried out in this embodiment. Inversion driving that alternates positive-polarity driving and negative-polarity driving may be carried out as well. In negative-polarity driving, the outputs of the driving units DR1 to DR10 in the capacitor driving circuit 20 are all set to 15 V in the reset, and the output voltage VQ is set to VC=7.5 V. The logic level of each bit in the tone data GD[10:1] is inverted ("0" to "1" and "1" to "0"), inputted into the capacitor driving circuit 20, and capacitive driving is carried out. In this case, a VQ of 7.5 V is outputted with respect to tone data GD[10:1] of "000h" (the h at the end indicates that the number within the "is a hexadecimal), a VQ of 2.5 V is outputted with respect to tone data GD[10:1] of "3FFh", and the data voltage range becomes 7.5 V to 2.5 V.

As described above, by carrying out charge redistribution between the capacitance CO of the capacitor circuit 10 and the electro-optical panel-side capacitance CP and carrying out capacitive driving, data voltages corresponding to the tone data GD[10:1] can be outputted. Driving using charge redistribution makes it possible to achieve settling at a higher speed than with amplifier driving, in which the voltages are settled through feedback control.

3. Transient Changes in Output Voltage in Capacitive Driving

Figure 3:
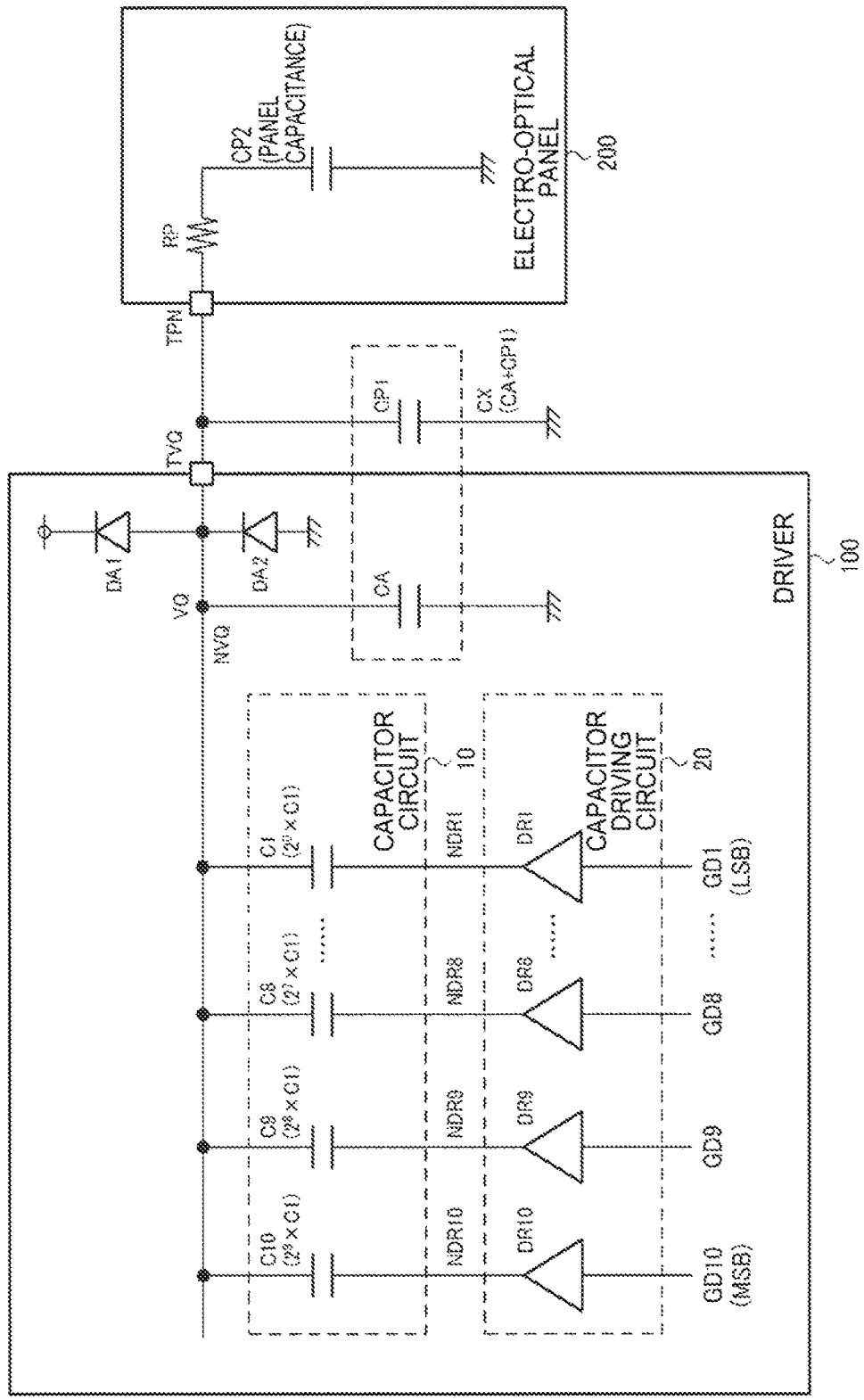
FIG. 3 is a schematic diagram illustrating a driver and an electro-optical panel.
Figure 4:
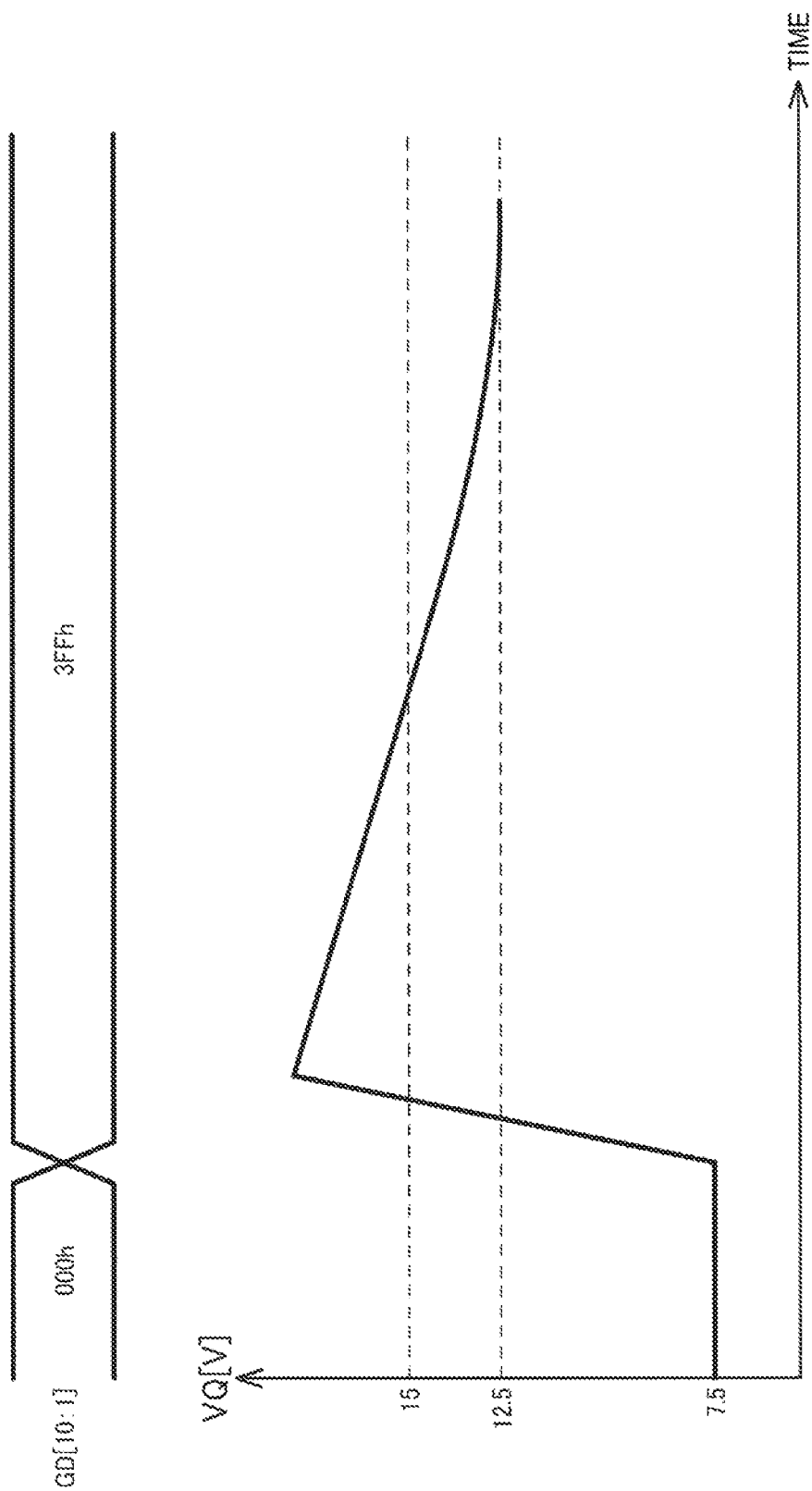
FIG. 4 is a schematic diagram illustrating a change over time in an output voltage in capacitive driving.

Next, transient changes in the output voltage VQ in capacitive driving will be described. FIG. 3 is a schematic diagram illustrating the driver 100 and the electro-optical panel 200. FIG. 4 is a schematic diagram illustrating a change over time in the output voltage VQ in capacitive driving according to FIG. 3.

Figure 11:
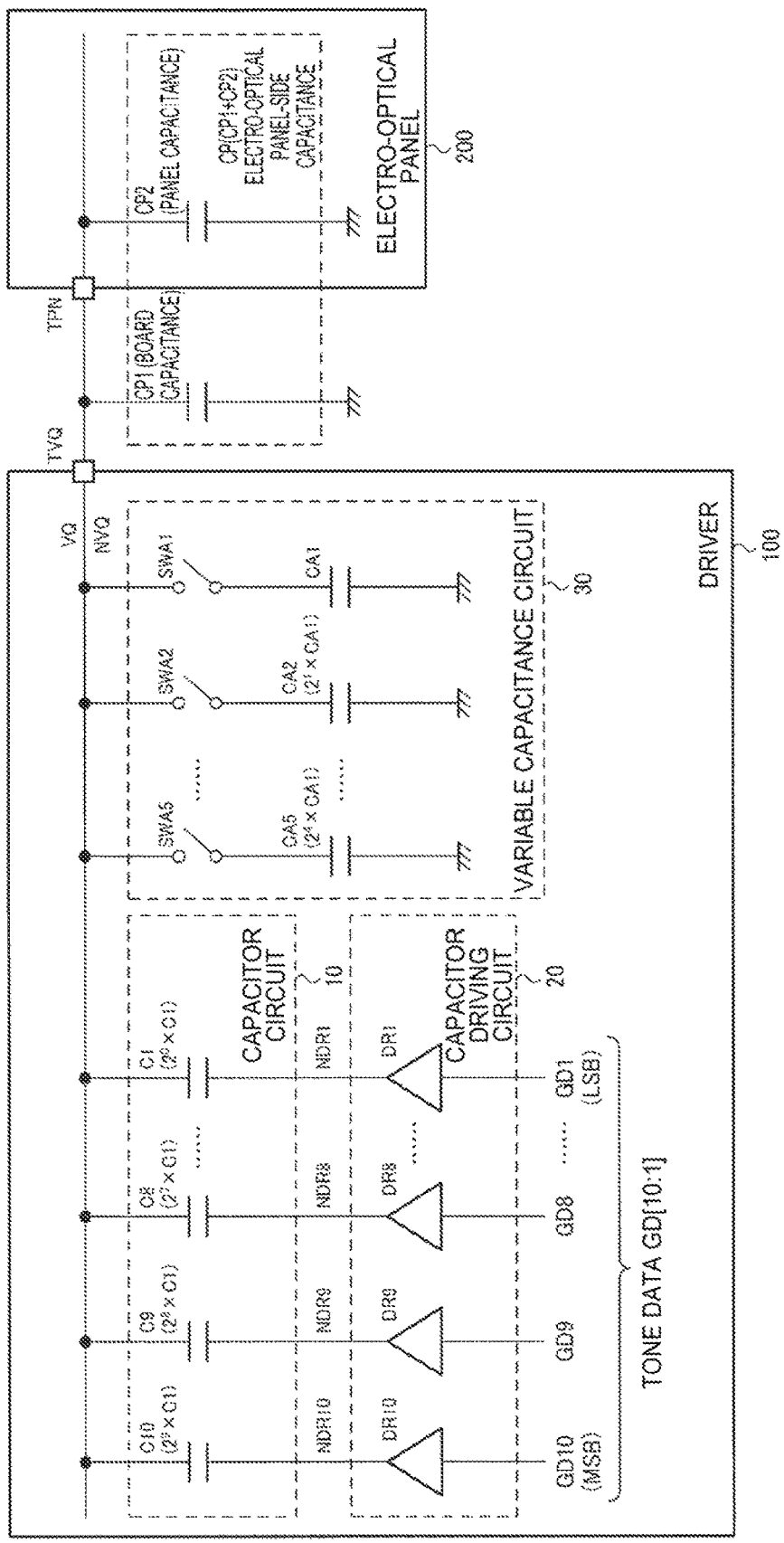
FIG. 11 illustrates a second example of the configuration of a driver.

As illustrated in FIG. 3, a resistance element RP for electrostatic protection is provided between the data voltage input terminal TPN and the panel capacitance CP2 of the electro-optical panel 200. A resistance value of the resistance element RP is 200 Ω–1 k Ω, for example. A variable capacitance circuit 30, which will be described later with reference to FIG. 11, is provided at the data voltage output node NVQ of the driver 100, and a capacitance of the variable capacitance circuit 30 corresponds to a capacitance CA. In the case where the capacitance of the capacitor circuit 10 is CO (=C1+C2+ . . . +C10), the capacitance CA is set so that CA+CP=2CO. Assuming that a result of adding the capacitance CA and the board capacitance CP1 is a capacitance CX (=CA+CP1), CX+CP2=2CO.

Assume that an output impedance of the driving units DR1 to DR10 of the capacitor driving circuit 20 is zero. In this case, charge redistribution between the capacitance CO of the capacitor circuit 10 and the capacitance CX is completed at the same time as when the outputs of the driving units DR1 to DR10 change. In other words, the output voltage VQ rises to a voltage determined by the ratio between the capacitance CO and the capacitance CX. Assume that as illustrated in FIG. 4, the tone data GD[10:1] has changed from "000h" to "3FFh", for example. While the data voltage changes from 7.5 V to 12.5 V in the case where charge redistribution among capacitances including the panel capacitance CP2 has occurred, the capacitance CX is lower than capacitance CX+CP2, and thus the output voltage VQ transiently exceeds 12.5 V. As described above, CX+CP2=2CO, but assume that, for example, CX=(½)·CO and CP2=(3/2)·CO. In this case, the output voltage VQ is 7.5 V+15 V·(CO/(CO+CX))=17.5 V at the point in time when the charge redistribution has occurred between the capacitance CO of the capacitor circuit 10 and the capacitance CX.

Note that the output impedance of the driving units DR1 to DR10 is not actually zero, and thus the rise in the output voltage VQ is less sharp than in the case where the charge redistribution is assumed to be completed instantly between the capacitance CO and the capacitance CX. Accordingly, the charge moves to the panel capacitance CP2 via the resistance element RP while the output voltage VQ rises, and a maximum value of the output voltage VQ drops. However, because fast capacitive driving is necessary to drive a high-resolution panel, a lower output impedance is desirable for the driving units DR1 to DR10.

After the output voltage VQ has reached the maximum value, charge redistribution occurs between the capacitances CO and CX and the capacitance CP2 via the resistance element RP, and thus the output voltage VQ approaches the desired data voltage (12.5 V). As indicated in FIG. 7 and the like, the capacitance CO of the capacitor circuit 10 is 64 pF, for example. Assuming that the resistance value of the resistance element RP of the electro-optical panel 200 is 500Ω, for example, a time constant of the capacitances CO, CX, CP2, and the resistance element RP is approximately 64 pF·500 Ω=32 ns.

As described above, in capacitive driving, the output voltage VQ may transiently exceed the power source voltage (15 V). As illustrated in FIG. 3, diodes DA1 and DA2, for example, are provided at the data voltage output terminal TVQ of the driver 100 as a circuit for electrostatic protection, and thus the charge escapes to the power source via the diode DA1 from the data voltage output node NVQ in the case where the output voltage VQ has exceeded the power source voltage. As illustrated in FIG. 2A, in capacitive driving, the desired data voltage is outputted by carrying out charge redistribution in a state where the charge is conserved, and thus the desired data voltage can no longer be obtained when the charge escapes. Note that in the case of negative-polarity driving, it is possible that the output voltage VQ will transiently fall below the power source voltage (0 V), in which case the charge will escape to the power source via the diode DA2 and the desired data voltage can no longer be obtained.

Meanwhile, in the case where the diodes DA1 and DA2 and so on provide insufficient electrostatic protection, it is possible that the output voltage VQ will exceed the breakdown voltage of the data voltage output terminal TVQ and result in electrostatic breakdown. For example, in the variable capacitance circuit 30, which will be described later with reference to FIG. 11, switching elements SWA1 to SWA5 (transistors, for example) are connected to the data voltage output node NVQ, and the switching elements SWA1 to SWA5 may experience electrostatic breakdown.

The phenomenon described above is caused by the resistance element for electrostatic protection in the electro-optical panel 200. In other words, a load-side capacitance (the panel capacitance CP2) being present outside of the driver (IC) rather than the load-side capacitance being present within the IC (as in JP-A-2000-341125 and so on, for example) is a factor.

4. Capacitor Driving Circuit

Figure 5A:
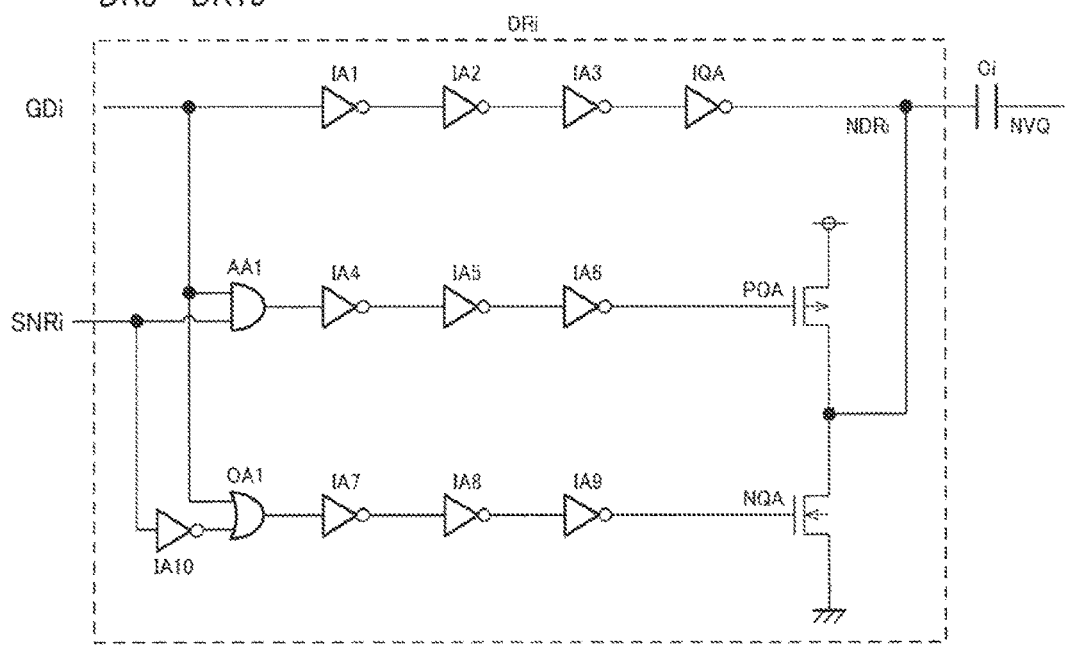
FIGS. 5A and 5B are examples of the detailed configuration of a capacitor driving circuit.
Figure 5B:
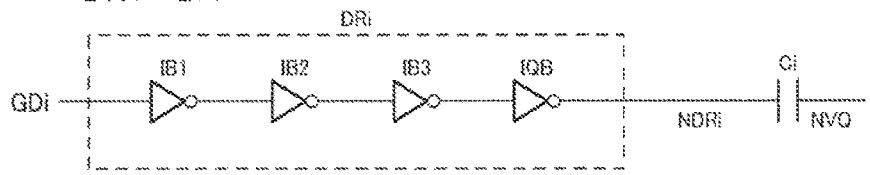

FIGS. 5A and 5B are examples of the detailed configuration of the capacitor driving circuit 20 according to this embodiment, which can solve the aforementioned problem. FIG. 5A is a diagram illustrating examples of the configurations of the driving units DR8 to DR10 that correspond to the most significant bit side of the tone data GD[10:1]. FIG. 5B is a diagram illustrating examples of the configurations of the driving units DR1 to DR7 that correspond to the least significant bit side of the tone data GD[10:1]. Although the border between the most significant bit side and the least significant bit side is between the seventh bit and the eighth bit here, the invention is not limited thereto. For example, it is sufficient for at least the driving unit DR10, which corresponds to the most significant bit, has the configuration illustrated in FIG. 5A.

As illustrated in FIG. 5A, each driving unit DRi of the driving units DR8 to DR10 on the most significant bit side includes logic inverting circuits IA1 to IA10 and IQA (inverters and buffers), an AND circuit AA1, an OR circuit OA1, a P-type transistor PQA, and an N-type transistor NQA.

The logic inverting circuits IA1 to IA3 and IQA are connected in series, and drive the capacitor Ci by buffering the bit GDi of the tone data. The logic inverting circuit IQA in the final stage is constituted of the largest-size transistor, and the size thereof determines the driving capability. The logic inverting circuits IA1 to IA3 in the previous stages serve as predrivers that drive the final stage (IQA).

The AND circuit AA1, the OR circuit OA1, the logic inverting circuits IA4 to IA10, the P-type transistor PQA, and the N-type transistor NQA serve as a circuit that switches the driving capability of the driving unit DRi. In other words, in the case where a control signal SNRi is active (high-level), the capacitor Ci is driven by buffering the bit GDi. In the case where the control signal SNRi is non-active (low-level), the P-type transistor PQA and the N-type transistor NQA turn off and the output enters a high-impedance state. In this switching circuit, the P-type transistor PQA and the N-type transistor NQA are in the final stage, and are the same size as, for example, a transistor that constitutes the logic inverting circuit IQA. In this case, the driving capability is cut in half when the control signal SNRi is non-active.

As illustrated in FIG. 5B, each driving unit DRi of the driving units DR1 to DR7 on the least significant bit side includes logic inverting circuits IB1 to IB3 and IQB (inverters and buffers).

The driving unit DRi on the least significant bit side does not include a switching circuit. The logic inverting circuits IB1 to IB3 and IQB are connected in series, and drive the capacitor Ci by buffering the bit GDi of the tone data. The logic inverting circuit IQB in the final stage is constituted of the largest-size transistor, and the size thereof determines the driving capability.

FIG. 6 is a comparative example indicating driving capabilities of the driving units DR1 to DR10. FIG. 6 illustrates the capacitances of the capacitors C1 to C10 and the sizes (gate widths W) of the P-type transistors and N-type transistors that constitute the final stages of the driving units DR1 to DR10. In addition, a ratio Di/Ci between a driving capability Di and the capacitance of the capacitor Ci, in the case where the driving capability Di corresponds to the size of the transistor (N-type, here), is indicated as well.

This comparative example is an example illustrating a case where the ratio Di/Ci is constant. A slope of a change in the output voltage of the driving unit DRi is represented by $dV/dt=(dQ/dt)/Ci=I/Ci$, and because a current I supplied to the capacitor Ci by the driving unit DRi is proportional to the transistor size, the slope $dV/dt$ is generally proportional to the ratio Di/Ci. In other words, in this comparative example, the slopes $dV/dt$ of the changes in the output voltages of the driving units DR1 to DR10 are almost the same. For example, in the case where the output voltages of the driving units DR1 to DR10 change from 0 V to 15 V, the slopes $dV/dt$ are the same, and thus the timing at which the voltages reach 15 V are also the same. This means that when viewed from the data voltage output node NVQ side, the supplies of charges from the capacitors C1 to C10 start simultaneously and end simultaneously (that is, charge supply peaks overlap). Accordingly, a peak value of the voltage VQ in FIG. 4 increases, and may exceed the power source voltage.

Meanwhile, the capacitance of the capacitor C10, which corresponds to the most significant bit, is 512 times ($2^9$ times) the capacitance of the capacitor C1, which corresponds to the least significant bit, and thus the transistor size is also 512 times in the case where the ratio Di/Ci is constant. Even if the transistor size of the final stage in the driving unit DR1 is set to the minimum value of the process rule, the transistor size that is 512 times will be extremely large (for example, the P-type transistor illustrated in FIG. 6 is greater than or equal to 9 mm). Considering the chip surface area and the like, this is an unrealistic size.

Accordingly, in this embodiment, driving capabilities on the most significant bit side are set to be lower than driving capabilities on the least significant bit side. FIGS. 7A and 7B illustrate examples of the driving capabilities of the driving units DR1 to DR10 according to this embodiment. Note that the size of the transistors of the driving units DR8 to DR10 whose driving capabilities can be switched are obtained by totaling the sizes of the transistor of the logic inverting circuit IQA, the P-type transistor PQA, and the N-type transistor NQA.

FIG. 7A is an example of driving capabilities in the case where control signals SNR8 to SNR10 have been made active. The driving capabilities of the driving units DR5 to DR10 on the most significant bit side are set to the same 6.25, and are lower than the driving capabilities of the driving units DR1 to DR4 on the least significant bit side. Specifically, the driving capabilities of the driving units DR1 to DR4 on the least significant bit side are set to decrease in order. The driving capabilities of the driving units DR5 to DR10 on the most significant bit side are set to lower values than a minimum value 12 of the driving capabilities of the driving units DR1 to DR4 on the least significant bit side.

The charge supply amounts from the capacitors C1 to C10 are greater on the most significant bit side, and thus the most significant bit side also contributes more to the voltage VQ. This is clear from Formula FE in FIG. 2A. In this embodiment, by setting the driving capability on the most significant bit side to be lower than the driving capability on the least significant bit side, the charge supply on the most significant bit side, which contributes more to the voltage VQ, can be delayed relative to the least significant bit side. Through this, the supply of charges from the capacitors on the most significant bit side is delayed (that is, the timings at which the charge supplies end are later than on the least significant bit side), and thus the charge supply peaks can be shifted and the peak value of the voltage VQ reduced. As a result, the chance that the power source voltage will be exceeded can be reduced.

FIG. 7B is an example of driving capabilities in the case where the control signals SNR8 to SNR10 have been made non-active. The driving capabilities of the driving units DR8 to DR10 that are capable of switching driving capability are set to half those in FIG. 7A, namely to 3.125. The driving capabilities of the driving units DR5 to DR7 remain at 6.25. In other words, the driving capabilities of the driving units DR8 to DR10 and the driving units DR5 to DR7 are the same, respectively, and of those, the driving capabilities of the driving units DR8 to DR10 on the most significant bit side are lower than the driving capabilities of the driving units DR5 to DR7. Of course, the driving capabilities of the driving units DR8 to DR10 are lower than the minimum value 12 of the driving capabilities of the driving units DR1 to DR4 on the least significant bit side.

By making it possible to switch the driving capabilities on the most significant bit side in this manner, the appropriate driving capabilities can be selected in accordance with the connection environment of the driver 100 (the type of the electro-optical panel 200, the design of a mounting board, and so on). This point will be described hereinafter.

Figure 8A:
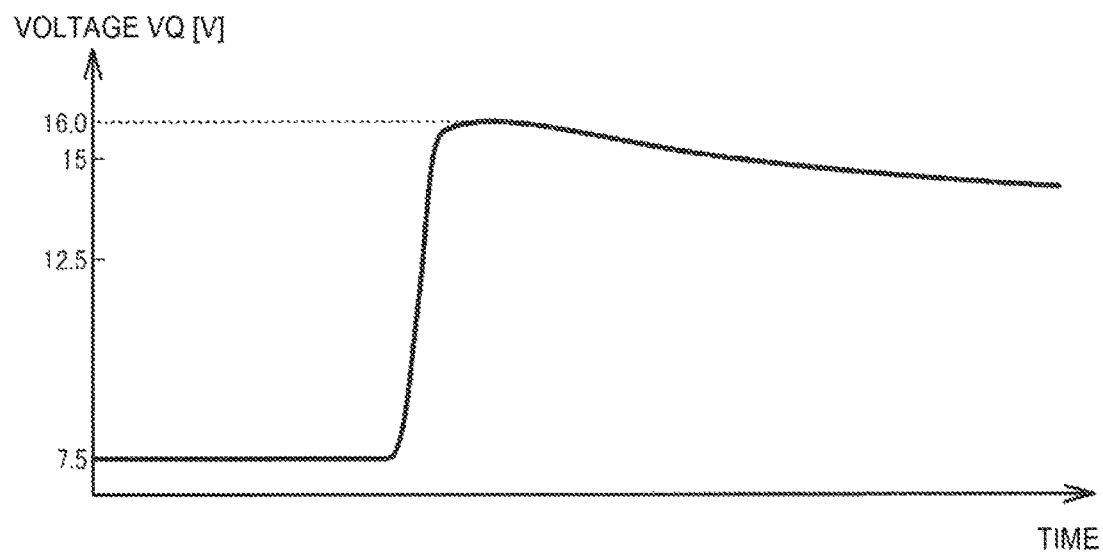
FIGS. 8A and 8B illustrate results of simulating an output voltage in capacitive driving.
Figure 8B:
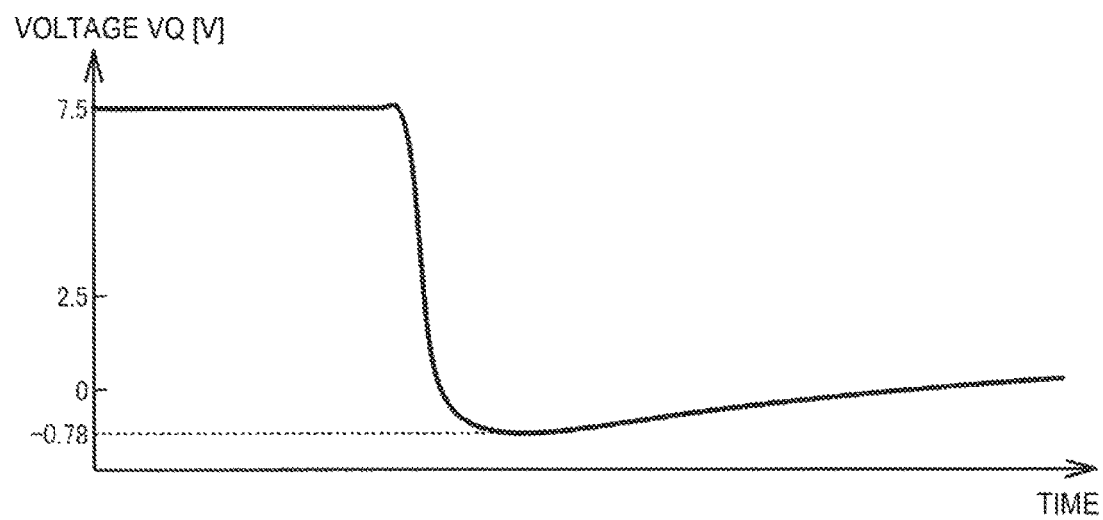

FIGS. 8A and 8B illustrate results of simulating the output voltage VQ in capacitive driving in the case where the control signals SNR8 to SNR10 have been made active (that is, in the case where the driving capabilities on the most significant bit side are higher).

FIG. 8A illustrates a waveform in the case where the tone data GD[10:1] has been changed from "000h" to "3FFh" in positive-polarity driving. FIG. 8B illustrates a waveform in the case where the tone data GD[10:1] has been changed from "000h" to "3FFh" in negative-polarity driving. In this example, the voltage exceeds the power source voltage of 15 V in the positive-polarity driving, and drops below the power source voltage 0 V in the negative-polarity driving.

Figure 9A:
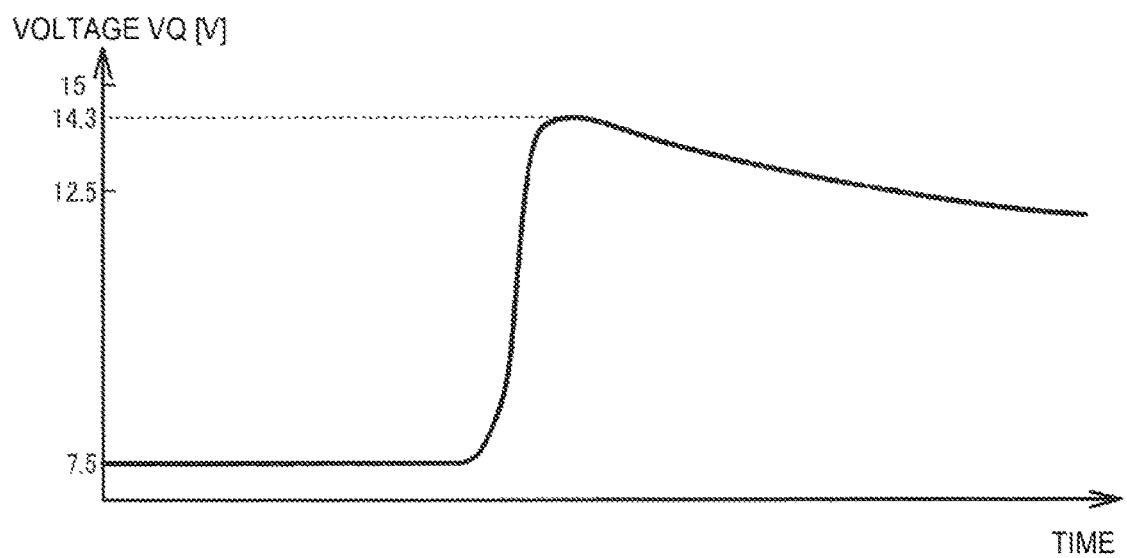
FIGS. 9A and 9B illustrate results of simulating an output voltage in capacitive driving.
Figure 9B:
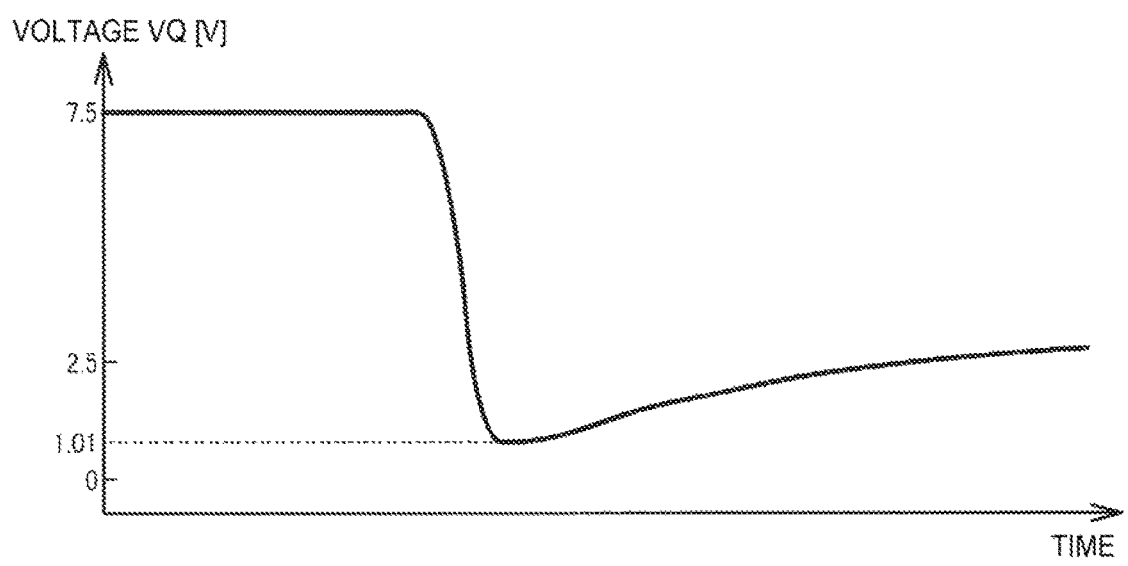

FIGS. 9A and 9B illustrate results of simulating the output voltage VQ in capacitive driving in the case where the control signals SNR8 to SNR10 have been made non-active (that is, in the case where the driving capabilities on the most significant bit side are lower).

FIG. 9A illustrates a waveform in the case where the tone data GD[10:1] has been changed from "000h" to "3FFh" in positive-polarity driving. FIG. 9B illustrates a waveform in the case where the tone data GD[10:1] has been changed from "000h" to "3FFh" in negative-polarity driving. In this example, the voltage does not exceed the power source voltage of 15 V in the positive-polarity driving, and does not drop below the power source voltage 0 V in the negative-polarity driving.

Based on the results of the stated simulation, first, it can be seen that lowering the driving capabilities on the most significant bit side makes it possible to reduce the peak value of the output voltage VQ. However, these simulation results are merely an example, and the peak value of the output voltage VQ will differ depending on the type of the electro-optical panel 200 connected to the driver 100. In other words, the ratio between the capacitance CO of the capacitor circuit 10 and the load-side capacitance CX+CP2 is 1:2, but the panel capacitance CP2 differs depending on the type of the electro-optical panel 200, and the capacitance CX changes in accordance therewith. The peak value of the output voltage VQ increases as the capacitance CX decreases, and thus it is easy for the peak value of the output voltage VQ to become high in the case where an electro-optical panel 200 having a high panel capacitance CP2 is connected. Conversely, it is easy for the peak value of the output voltage VQ to become low in the case where an electro-optical panel 200 having a low panel capacitance CP2 is connected.

With respect to this point, according to this embodiment, the configuration is such that the driving capabilities on the most significant bit side can be switched, and thus the optimal driving capability can be selected in accordance with the type of the electro-optical panel 200. For example, a low driving capability setting can be selected in the case where a high driving capability setting will cause the peak value of the output voltage VQ to exceed the power source voltage. Alternatively, a high driving capability setting can be selected in the case where a high driving capability setting will not cause the peak value of the output voltage VQ to exceed the power source voltage. In addition, although a high driving capability is desirable from the standpoint of realizing high-speed driving as described above, in this embodiment, the highest driving capability can be selected within a range where the peak value of the output voltage VQ does not exceed the power source voltage.

According to the embodiment described thus far, the driver 100 includes the capacitor driving circuit 20 and the capacitor circuit 10. The capacitor driving circuit 20 outputs first to tenth capacitor driving voltages (0 V or 15 V), corresponding to the tone data GD[10:1], to first to tenth capacitor driving nodes NDR1 to NDR10. The capacitor circuit 10 has the first to tenth capacitors C1 to C10 provided between the first to tenth capacitor driving nodes NDR1 to NDR10 and the data voltage output terminal TVQ. The capacitor driving circuit 20 includes the first to tenth driving units DR1 to DR10 that output the first to tenth capacitor driving voltages. In addition, in the case where the capacitance of the tenth capacitor among the first to tenth capacitors C1 to C10 is the highest, at least the tenth driving unit DR10 of the first to tenth driving units DR1 to DR10 is a driving unit whose driving capability is variable.

By providing the driving unit DR10 that drives the capacitor of the capacitors C1 to C10 having the highest capacitance with a variable driving capability, at least the driving capability of the driving unit DR10 that drives the capacitor C10 having the highest capacitance can be reduced. Through this, the peak value when the voltage VQ outputted through capacitive driving changes transiently can be reduced (or increased, in the case of negative-polarity driving). In other words, the capacitor C10, which has the highest capacitance of the capacitors C1 to C10, also supplies the greatest charge to the data voltage output node NVQ, and thus of the driving units DR1 to DR10, reducing the driving capability of the driving unit DR10 contributes the most to the reduction of the peak value of the output voltage VQ.

In addition, by making the driving capability variable, a high driving capability setting can be made within a range in which the peak value of the output voltage VQ does not exceed (or drop below, in the case of negative-polarity driving) the power source voltage. Through this, the optimal driving capability can be set in accordance with the connection environment of the driver 100. That is, the peak value of the output voltage VQ can be reduced (or increased, in the case of negative-polarity driving) while ensuring high-speed settling in the capacitive driving.

Although this embodiment describes a case where the driving capability is switched between two levels as an example, the configuration for making the driving capability variable is not limited thereto. For example, the configuration may be such that the driving capability can be switched among even more levels.

Here, the "driving capability" is the capability to drive a capacitor to be driven, and is a capability to supply a charge (a current) to the capacitor. The driving capability is expressed, for example, by the size of a transistor (an output stage, a final stage) that drives the capacitor, among the transistors that constitute the driving unit, an on resistance of that transistor, and so on.

In addition, in this embodiment, in the case where the driving capabilities of the first to tenth driving units DR1 to DR10 are represented by D1 to D10 and the capacitances of the first to tenth capacitors C1 to C10 are represented by C1 to C10, the driving capability D10 of the tenth driving unit DR10 is set so that D10/C10<D1/C1. For example, in the example illustrated in FIG. 7A, D10/C10=6.25<96=D1/C1, and in the example illustrated in FIG. 7B, D10/C10=3.125<96=D1/C1.

As described above, the ratio Di/Ci between the driving capability Di and the capacitance of the capacitor Ci determines the slope in the change of the output voltage of the driving unit DRi. In this embodiment, by setting D10/C10 to be less than D1/C1, at least the slope of the change in the voltage that drives the capacitor C10 having the highest capacitance can be made lower than the slope of the change in the voltage that drives the capacitor C1 having the lowest capacitance. Through this, the speed of the supply of the charge from the capacitor C10 (that is, the current) having the greatest charge supply amount (that pushes the peak value of the output voltage VQ up the most) can be reduced, and thus the peak value of the output voltage VQ can be effectively reduced.

In addition, in this embodiment, the eighth to tenth driving units DR8 to DR10 of the first to tenth driving units DR1 to DR10 (broadly defined as jth to nth driving units, where j is a natural number of 1≤j≤n) are driving units whose driving capabilities are variable. The first to seventh driving units DR1 to DR7 of the first to tenth driving units DR1 to DR10 (broadly defined as first to j−1th driving units) are driving units whose driving capabilities are fixed.

As described above, the peak value of the output voltage VQ is pushed higher the greater the charge supply amount of the capacitor is. With respect to this point, according to this embodiment, the driving capabilities of the driving units DR8 to DR10 that drive the capacitors C8 to C10 on the most significant bit side, where the capacitances are higher, can be set to be variable. Through this, the driving capabilities on the most significant bit side, where there is a greater influence on the peak value of the output voltage VQ, can be reduced, which makes it possible to effectively reduce the peak value of the output voltage VQ. In addition, making the driving capabilities variable makes it possible to reduce the peak value of the output voltage VQ while ensuring high-speed settling in the capacitive driving.

In addition, in this embodiment, the driving capabilities of the eighth to tenth driving units are set so that D8/C8<D1/C1, D9/C9<D1/C1, and D10/C10<D1/C1 (broadly defined as Di/Ci<D1/C1, where i is a natural number of j≤i≤n).

By doing so, the slope of the change in the voltages that drive the capacitors C8 to C10 on the most significant bit side, where the capacitances are higher, can be made lower than the slope of the change in the voltage that drives the capacitor C1 having the lowest capacitance. Through this, the speed of the supplies of the charges from the capacitors C8 to C10 (that is, the currents) having the greatest charge supply amounts (that push the peak value of the output voltage VQ up the most) can be reduced, and thus the peak value of the output voltage VQ can be effectively reduced.

Meanwhile, setting the driving capabilities on the most significant bit side to be the same as the driving capabilities on the least significant bit side causes a problem where the transistor size in the driving units on the most significant bit side is too large, as described with reference to the comparative example illustrated in FIG. 6. With respect to this point, according to this embodiment, reducing Di/Ci on the most significant bit side makes it possible to reduce the transistor size in the driving units on the most significant bit side.

In addition, according to this embodiment, the driver 100 includes a storage unit that stores setting values (the control signals SNR8 to SNR10) for the driving capabilities of the driving units DR8 to DR10 whose driving capabilities are variable.

For example, the storage unit is a register (a register unit 48), as will be described later with reference to FIG. 13. Note that the storage unit is not limited to a register, and may be any entity capable of storing a setting value. For example, the storage unit may be a fuse (where the setting value is set by cutting with a laser during manufacture, for example), a non-volatile memory (an EEPROM or the like, for example), and so on.

By doing so, the driving capabilities can be set in a variable manner based on the setting values stored in the storage unit. For example, in the configuration example illustrated in FIG. 5A, the driving capability can be switched by inputting the control signal SNRi to the driving unit DRi based on the setting value. Then, by storing, in the storage unit, setting values for the driving capabilities based on the type of the electro-optical panel 200 connected to the driver 100, the optimal driving capabilities for the type of the electro-optical panel 200 can be selected.

5. Second Example of Configuration of Driver

Next, consider again the data voltage in the first configuration example illustrated in FIG. 1. FIG. 2A assumes that the ratio between the capacitance CO of the capacitor circuit 10 and the electro-optical panel-side capacitance CP is set to 1:2, but a maximum value of the data voltage in cases also including cases where the ratio is not 1:2 will be considered. As will be described hereinafter, if the driver 100 is to be created in a generic manner so as to be applicable in a variety of electro-optical panels 200, the ratio cannot be kept at 1:2, leading to a problem that the data voltage cannot be outputted in a constant range.

As illustrated in FIG. 10A, first, the capacitor circuit 10 is reset. In other words, "000h" is set for the tone data GD[10:1] (the h at the end indicates that the number within the "is a hexadecimal) and all of the outputs of the driving units DR1 to DR10 are set to 0 V. Meanwhile, the voltage VQ is set to VC=7.5 V, as indicated by Formula FA in FIG. 10A. In this reset, the entire charge accumulated in the capacitance CO of the capacitor circuit 10 and the electro-optical panel-side capacitance CP is conserved in the following data voltage output. Through this, data voltage that takes a reset voltage VC (a common voltage) as a reference is outputted.

As illustrated in FIG. 10B, the maximum value of the data voltage is outputted in the case where the tone data GD[10:1] is set to "3FFh" and the outputs of all of the driving units DR1 to DR10 are set to 15 V. The data voltage at this time can be found from the principle of the conservation of charge, and is a value indicated by Formula FB in FIG. 10B.

As illustrated in FIG. 10C, a desired data voltage range is assumed to be 5 V, for example. Because the reset voltage VC of 7.5 V is the reference, the maximum value is 12.5 V. This data voltage is realized when, based on the Formula FB, CO/(CO+CP)=⅓. In other words, relative to the electro-optical panel-side capacitance CP, the capacitance CO of the capacitor circuit 10 may be set to CP/2 (in other words, CP=2CO). The 5 V data voltage range can be realized by designing CO to be equal to CP/2 in this manner for a specific electro-optical panel 200 and a mounting board.

However, depending on the type of the electro-optical panel 200, the design of the mounting board, and so on, the electro-optical panel-side capacitance CP has a range of approximately 50 pF to 120 pF. Meanwhile, even with the same types of electro-optical panel 200 and mounting board, in the case where a plurality of electro-optical panels are connected (when connecting three R, G, and B electro-optical panels in a projector, for example), the lengths of wires for connecting the respective electro-optical panels to drivers differ, and thus the board capacitance CP1 will not necessary be the same.

For example, assume that the design is such that the capacitance CO of the capacitor circuit 10 for a given electro-optical panel 200 and mounting board is CP=2CO. In the case where a different type of electro-optical panel or mounting board is connected to this capacitor circuit 10, CP may become CO/2, 5CO, or the like. In the case where CP=CO/2, the maximum value of the data voltage will become 17.5 V, exceeding the power source voltage of 15 V, as illustrated in FIG. 10C. In this case, there is a problem not only in terms of the data voltage range but also in terms of the breakdown voltages of the driver 100, the electro-optical panel 200, and so on. Meanwhile, in the case where CP=5CO, the maximum value of the data voltage is 10 V, and thus a sufficient data voltage range cannot be achieved.

As such, in the case where the capacitance CO of the capacitor circuit 10 is set in accordance with the electro-optical panel-side capacitance CP, there is an issue that a dedicated design is necessary for the driver 100 with respect to the electro-optical panel 200, the mounting board, or the like. In other words, each time the type of the electro-optical panel 200, the design of the mounting board, or the like is changed, it is necessary to redesign the driver 100 specifically therefor.

FIG. 11 illustrates a second example of the configuration of a driver according to this embodiment, capable of solving the stated problem. This driver 100 includes the capacitor circuit 10, the capacitor driving circuit 20, and the variable capacitance circuit 30. Note that constituent elements that are the same as constituent elements already described are assigned the same reference numerals, and descriptions of those constituent elements are omitted as appropriate.

The variable capacitance circuit 30 is a circuit, serving as a capacitance connected to the data voltage output node NVQ, whose capacitance value can be set in a variable manner. Specifically, the variable capacitance circuit 30 includes first to mth switching elements SWA1 to SWAm (where m is a natural number of 2 or more), and first to mth adjusting capacitors CA1 to CAm. Note that the following will describe an example in which m=6.

The first to sixth switching elements SWA1 to SWA6 are configured as, for example, P-type or N-type MOS transistors, or as transfer gates that combine a P-type MOS transistor and an N-type MOS transistor. Of the switching elements SWA1 to SWA6, one end of an sth switching element SWAs (where s is a natural number no greater than m, which is 6) is connected to the data voltage output node NVQ.

The first to sixth adjusting capacitors CA1 to CA6 have capacitance values weighted by a power of 2. Specifically, of the adjusting capacitors CA1 to CA6, an sth adjusting capacitor CAs has a capacitance value of $2^{(s-1)} \times CA1$. One end of the sth adjusting capacitor CAs is connected to another end of the sth switching element SWAs. Another end of the sth adjusting capacitor CAs is connected to a low-potential side power source (broadly defined as a reference voltage node).

For example, in the case where CA1 is set to 1 pF, the capacitance of the variable capacitance circuit 30 is 1 pF while only the switching element SWA1 is on, whereas the capacitance of the variable capacitance circuit 30 is 63 pF (=1 pF+2 pF+ . . . +32 pF) while all the switching elements SWA1 to SWA6 are on. Because the capacitance values are weighted by a power of 2, the capacitance of the variable capacitance circuit 30 can be set from 1 pF to 63 pF in 1 pF (CA1) steps in accordance with whether the switching elements SWA1 to SWA6 are on or off.

6. Data Voltages in Second Configuration Example

Data voltages outputted by the driver 100 according to this embodiment will be described. Here, a range of the data voltages (a data voltage maximum value) will be described.

As illustrated in FIG. 12A, first, the capacitor circuit 10 is reset. In other words, the outputs of all the driving units DR1 to DR10 are set to 0 V and the voltage VQ is set to VC=7.5 V (Formula FC). In this reset, the entire charge accumulated in the capacitance CO of the capacitor circuit 10, a capacitance CA of the variable capacitance circuit, and the electro-optical panel-side capacitance CP is conserved in the following data voltage output.

As illustrated in FIG. 12B, the maximum value of the data voltage is outputted in the case where the outputs of all of the driving units DR1 to DR10 are set to 15 V. The data voltage in this case is a value indicated by Formula FD in FIG. 12B.

As illustrated in FIG. 12C, a desired data voltage range is assumed to be 5 V, for example. The maximum value of 12.5 V for the data voltage is realized in the case where, from Formula FD, CO/(CO+(CA+CP))=⅓, or in other words, in the case where CA+CP=2CO. CA is the capacitance of the variable capacitance circuit, and can thus be set freely, which in turn means that the CA can be set to 2CO−CP for the provided CP. In other words, regardless of the type of the electro-optical panel 200 connected to the driver 100, the design of the mounting board, or the like, the data voltage range can always be set to 7.5 V to 12.5 V.

According to the second configuration example described thus far, the driver 100 includes the variable capacitance circuit 30. The variable capacitance circuit 30 is provided between the data voltage output terminal TVQ and a node at a reference voltage (the voltage of the low-potential side power source, namely 0 V). Then, the capacitance CA of the variable capacitance circuit 30 is set so that a capacitance CA+CP obtained by adding the capacitance CA of the variable capacitance circuit 30 and the electro-optical panel-side capacitance CP (this will be called a "driven-side capacitance" hereinafter) and the capacitance CO of the capacitor circuit 10 (this will be called a "driving-side capacitance" hereinafter) have a prescribed capacitance ratio relationship (CO:(CA+CP)=1:2, for example).

Here, the capacitance CA of the variable capacitance circuit 30 is a capacitance value set for the variable capacitance of the variable capacitance circuit 30. In the example of FIG. 11, this is obtained by taking the total of the capacitances of the adjusting capacitors connected to switching elements, of the switching elements SWA1 to SWA6, that are on. Meanwhile, the electro-optical panel-side capacitance CP is a capacitance externally connected to the data voltage output terminal TVQ (parasitic capacitance, circuit element capacitance). In the example illustrated in FIG. 11, this is the board capacitance CP1 and the panel capacitance CP2. Meanwhile, the capacitance CO of the capacitor circuit 10 is the total of the capacitances of the capacitors C1 to C10.

The prescribed capacitance ratio relationship refers to a relationship in a ratio between the driving-side capacitance CO and the driven-side capacitance CA+CP. This is not limited to a capacitance ratio in the case where the values of each capacitance are measured (where the capacitance values are explicitly determined). For example, the capacitance ratio may be estimated from the output voltage VQ for prescribed tone data GD[10:1]. The electro-optical panel-side capacitance CP is normally not a measured value obtained in advance, and thus the capacitance CA of the variable capacitance circuit 30 cannot be determined directly. Accordingly, as will be described later with reference to FIG. 15, the capacitance CA of the variable capacitance circuit 30 is determined so that, for example, a VQ of 10 V is outputted for a median value "200h" of the tone data GD[10:1]. In this case, the capacitance ratio is ultimately estimated as being CO:(CA+CP)=1:2, and the capacitance CP can be estimated from this ratio and the capacitance CA (can be estimated, but the capacitance CP need not be known).

In the first configuration example illustrated in FIG. 1 and the like, there is an issue in that a design change is necessary each time the connection environment of the driver 100 (the design of the mounting board, the type of the electro-optical panel 200, or the like) changes.

With respect to this point, according to the second configuration example, a generic driver 100 that does not depend on the connection environment of the driver 100 can be realized by providing the variable capacitance circuit 30. In other words, even in the case where the electro-optical panel-side capacitance CP is different, the prescribed capacitance ratio relationship (for example, CO:(CA+CP)=1:2) can be realized by adjusting the capacitance CA of the variable capacitance circuit 30 in accordance therewith. The data voltage range (7.5 V to 12.5 V in the example illustrated in FIGS. 12A to 12C) is determined by this capacitance ratio relationship, and thus a data voltage range that does not depend on the connection environment can be realized.

In addition, in this embodiment, the capacitor driving circuit 20 outputs the first voltage level (0 V) or the second voltage level (15 V) as driving voltages corresponding to the respective first to tenth capacitor driving voltages, based on the first to tenth bits GD1 to GD10 of the tone data GD[10:1]. The prescribed capacitance ratio relationship is determined by a voltage relationship between a voltage difference between the first voltage level and the second voltage level (15 V) and the data voltage outputted to the data voltage output terminal TVQ (the output voltage VQ).

In the example illustrated in FIGS. 12A to 12C, the range of data voltages outputted to the data voltage output terminal TVQ is 5 V (7.5 V to 12.5 V), for example. In this case, the prescribed capacitance ratio relationship is determined so that the voltage relationship is realized between the voltage difference between the first voltage level and the second voltage level (15 V) and the data voltage range (5 V). In other words, a capacitance ratio of CO:(CA+CP)=1:2 at which 15 V is divided to 5 V through voltage division by the capacitance CO and the capacitance CA+CP becomes the prescribed capacitance ratio relationship.

By doing so, the prescribed capacitance ratio relationship of CO:(CA+CP)=1:2 can be determined from the voltage relationship between the voltage difference between the first voltage level and the second voltage level (15 V) and the range of data voltages outputted to the data voltage output terminal TVQ (a range of 5 V). Conversely, whether or not the prescribed capacitance ratio relationship is realized can be determined by examining the voltage relationship. In other words, even if the electro-optical panel-side capacitance CP is not known, the capacitance CA of the variable capacitance circuit 30 at which the capacitance ratio of CO:(CA+CP)=1:2 is realized can be determined from the voltage relationship (the flow illustrated in FIG. 15, for example).

7. Detailed Example of Configuration of Driver

Figure 13:
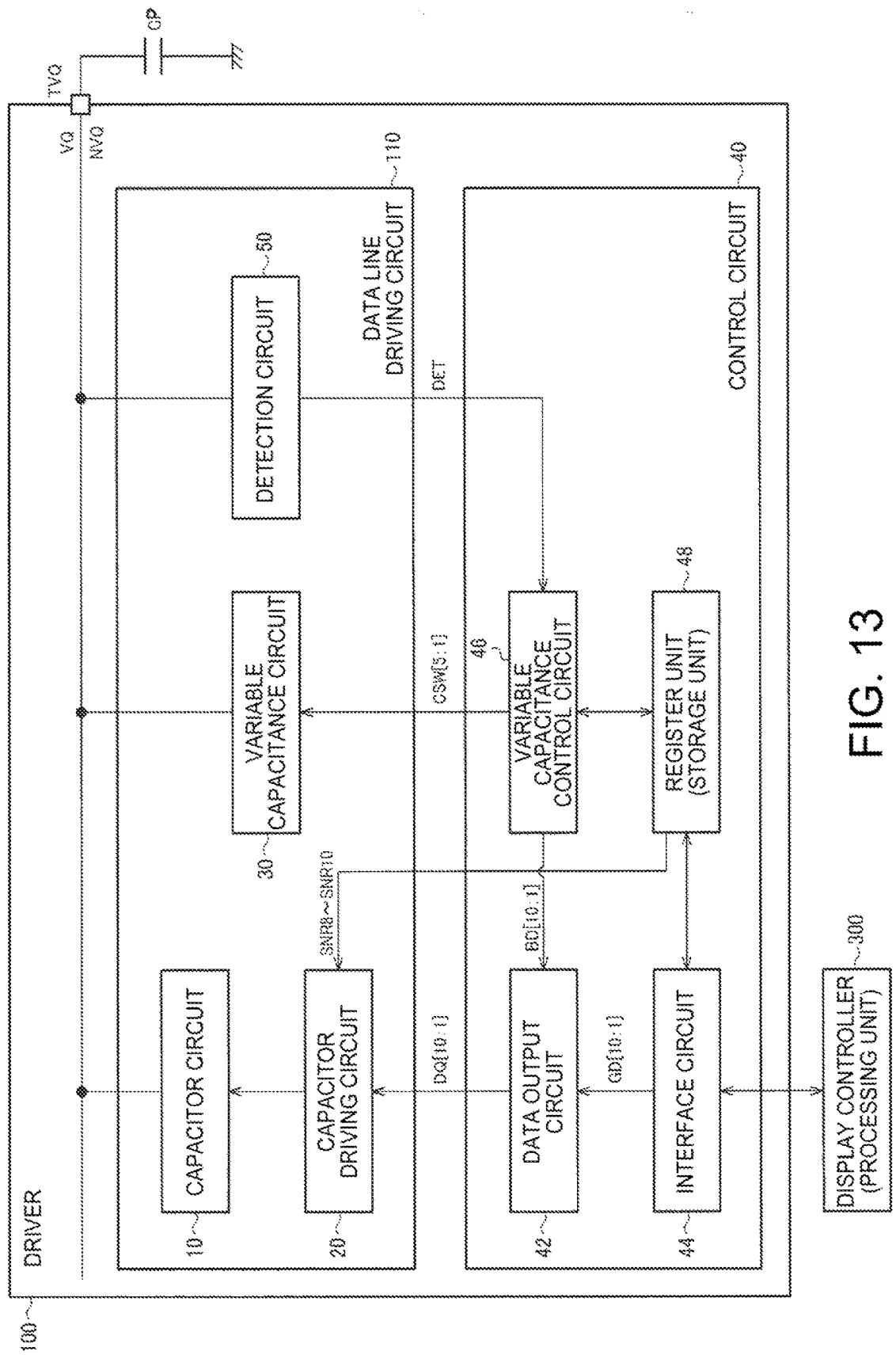
FIG. 13 illustrates an example of the detailed configuration of a driver.

FIG. 13 illustrates a detailed example of the configuration of the driver according to this embodiment. This driver 100 includes a data line driving circuit 110 and the control circuit 40. The data line driving circuit 110 includes the capacitor circuit 10, the capacitor driving circuit 20, the variable capacitance circuit 30, and a detection circuit 50. The control circuit 40 includes a data output circuit 42, an interface circuit 44, a variable capacitance control circuit 46, and the register unit 48 (the storage unit). Note that constituent elements that are the same as constituent elements already described are assigned the same reference numerals, and descriptions of those constituent elements are omitted as appropriate.

A single data line driving circuit 110 is provided corresponding to a single data voltage output terminal TVQ. Although the driver 100 includes a plurality of data line driving circuits and a plurality of data voltage output terminals, only one is illustrated in FIG. 13.

The interface circuit 44 carries out an interfacing process between a display controller 300 (broadly defined as a processing unit) that controls the driver 100 and the driver 100. For example, the interfacing process is carried out on serial communication such as LVDS (Low Voltage Differential Signaling) or the like. In this case, the interface circuit 44 includes an I/O circuit that inputs/outputs serial signals and a serial/parallel conversion circuit that carries out serial/parallel conversion on control data, image data, and so on. Meanwhile, a line latch that latches the image data inputted from the display controller 300 and converted into parallel data is also included. The line latch latches image data corresponding to a single horizontal scanning line at one time, for example.

The data output circuit 42 extracts the tone data GD[10:1] to be outputted to the capacitor driving circuit 20 from the image data corresponding to the horizontal scanning line, and outputs this data as data DQ[10:1]. The data output circuit 42 includes, for example, a timing controller that controls a driving timing of the electro-optical panel 200, a selection circuit that selects the tone data GD[10:1] from the image data corresponding to the horizontal scanning line, and an output latch that latches the selected tone data GD[10:1] as the data DQ[10:1]. As will be described later with reference to FIG. 17 and so on, in the case of phase expansion driving, the output latch latches eight pixels' worth of the tone data GD[10:1] (equivalent to the number of data lines DL1 to DL8) at one time. In this case, the timing controller controls the operational timing of the selection circuit, the output latch, and so on in accordance with the driving timing of the phase expansion driving. Meanwhile, a horizontal synchronization signal, a vertical synchronization signal, and so on may be generated based on the image data received by the interface circuit 44. Furthermore, a signal (ENBX) for controlling the switching elements (SWEP1 and the like) in the electro-optical panel 200 on and off, a signal for controlling gate driving (selection of horizontal scanning lines in the electro-optical panel 200), and so on may be outputted to the electro-optical panel 200.

The detection circuit 50 detects the voltage VQ at the data voltage output node NVQ. Specifically, the detection circuit 50 compares a prescribed detection voltage with the voltage VQ and outputs a result thereof as a detection signal DET. For example, DET="1" is outputted in the case where the voltage VQ is greater than or equal to the detection voltage, and DET="0" is outputted in the case where the voltage VQ is less than the detection voltage.

The variable capacitance control circuit 46 sets the capacitance of the variable capacitance circuit 30 based on the detection signal DET. The flow of this setting process will be described later with reference to FIG. 15. The variable capacitance control circuit 46 outputs a setting value CSW[6:1] as a control signal for the variable capacitance circuit 30. This setting value CSW[6:1] is constituted of first to sixth bits CSW6 to CSW1 (first to mth bits). A bit CSWs (where s is a natural number no greater than m, which is 6) is inputted into the switching element SWAs of the variable capacitance circuit 30. For example, in the case where the bit CSWs="0", the switching element SWAs turns off, whereas in the case where the bit CSWs="1", the switching element SWAs turns on. In the case where the setting process is carried out, the variable capacitance control circuit 46 outputs detection data BD[10:1]. Then, the data output circuit 42 outputs the detection data BD[10:1] to the capacitor driving circuit 20 as the output data DQ[10:1].

The register unit 48 stores the setting value CSW[6:1] of the variable capacitance circuit 30 set through the setting process, and setting values (the control signals SNR8 to SNR10) that set the driving capabilities of the driving units DR8 to DR10 on the most significant bit side in the capacitor driving circuit 20. In addition, the register unit 48 is configured to be accessible from the display controller 300 via the interface circuit 44. In other words, the display controller 300 can read out and write the setting value CSW[6:1] and SNR8 to SNR10 to and from the register unit 48.

Figure 14:
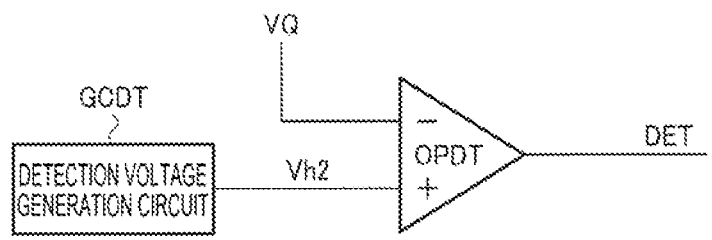
FIG. 14 illustrates an example of the detailed configuration of a detection circuit.

FIG. 14 illustrates an example of the detailed configuration of the detection circuit 50. The detection circuit 50 includes a detection voltage generation circuit GCDT that generates a detection voltage Vh2 and a comparator OPDT that compares the voltage VQ at the data voltage output node NVQ with the detection voltage Vh2.

The detection voltage generation circuit GCDT outputs the predetermined detection voltage Vh2 by a circuit such as a voltage division circuit using a resistance element, for example. Alternatively, a variable detection voltage Vh2 may be outputted through register settings or the like. In this case, the detection voltage generation circuit GCDT may be a D/A conversion circuit that D/A-converts a register setting value.

8. Process for Setting Capacitance of Variable Capacitance Circuit

Figure 15:
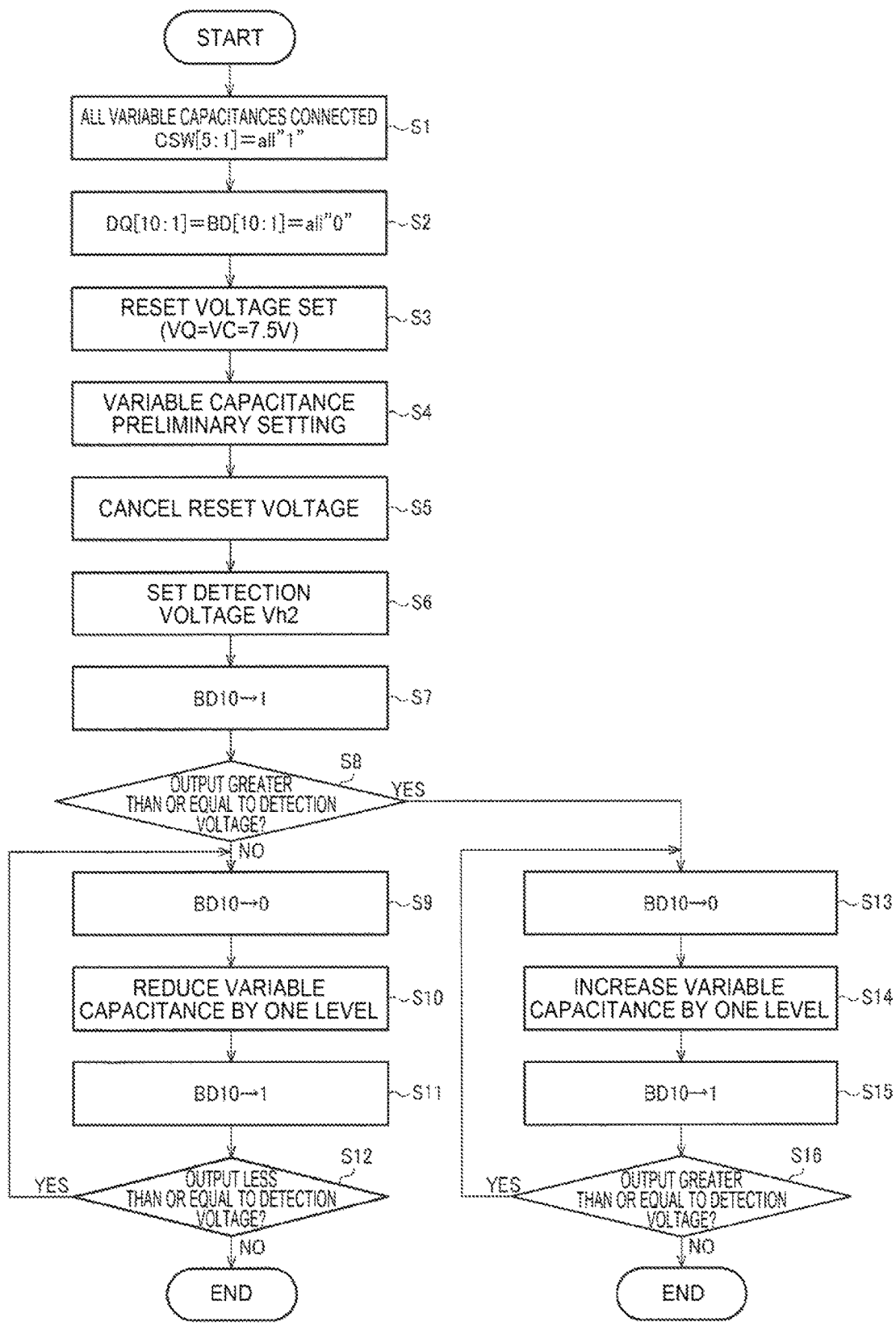
FIG. 15 is a flowchart illustrating a process for setting a capacitance of a variable capacitance circuit.

FIG. 15 is a flowchart illustrating a process for setting the capacitance of the variable capacitance circuit 30. This process is carried out, for example, during startup (an initialization process) when the power of the driver 100 is turned on.

As illustrated in FIG. 15, when the process starts, the setting value CSW[6:1] of "3Fh" is outputted, and all of the switching elements SWA1 to SWA6 of the variable capacitance circuit 30 are turned on (step S1). Next, the detection data BD[10:1] of "000h" is outputted, and the outputs of all of the driving units DR1 to DR10 of the capacitor driving circuit 20 are set to 0 V (step S2). Next, the output voltage VQ is set to the reset voltage VC of 7.5 V (step S3). This reset voltage VC is supplied, for example, from the exterior via a terminal TVC.

Next, the capacitance of the variable capacitance circuit 30 is preliminarily set (step S4). For example, the setting value CSW[6:1] is set to "1Fh". In this case, the switching element SWA6 turns off and the switching elements SWA5 to SWA1 turn on, and thus the capacitance is half the maximum value. Next, the supply of the reset voltage VC to the output voltage VQ is canceled (step S5). Then, the detection voltage Vh2 is set to a desired voltage (step S6). For example, the detection voltage Vh2 is set to 10 V.

Next, the MSB of the detection data BD[10:1] is changed from BD10="0" to BD10="1" (step S7). Then, it is detected whether or not the output voltage VQ is greater than or equal to the detection voltage Vh2 of 10 V (step S8).

In the case where the output voltage VQ is less than the detection voltage Vh2 of 10 V in step S8, the bit BD10 is returned to "0" (step S9). Next, 1 is subtracted from the setting value CSW[6:1] of "1Fh" for "1Eh" and the capacitance of the variable capacitance circuit 30 is lowered by one level (step S10). Next, the bit BD10 is set to "1" (step S11). Then, it is detected whether or not the output voltage VQ is less than or equal to the detection voltage Vh2 of 10 V (step S12). The process returns to step S9 in the case where the output voltage VQ is less than or equal to the detection voltage Vh2 of 10 V, and the process ends in the case where the output voltage VQ is greater than the detection voltage Vh2 of 10 V.

In the case where the output voltage VQ is greater than or equal to the detection voltage Vh2 of 10 V in step S8, the bit BD10 is returned to "0" (step S13). Next, 1 is added to the setting value CSW[6:1] of "1Fh" for "20h" and the capacitance of the variable capacitance circuit 30 is raised by one level (step S14). Next, the bit BD10 is set to "1" (step S15). Then, it is detected whether or not the output voltage VQ is greater than or equal to the detection voltage Vh2 of 10 V (step S16). The process returns to step S13 in the case where the output voltage VQ is greater than or equal to the detection voltage Vh2 of 10 V, and the process ends in the case where the output voltage VQ is less than the detection voltage Vh2 of 10 V.

FIGS. 16A and 16B schematically illustrate the setting value CSW[6:1] being determined through the stated steps S8 to S16.

In the aforementioned flow, the MSB of the detection data BD[10:1] is set to BD10="1", and the output voltage VQ at that time is compared to the detection voltage Vh2 of 10 V. BD[10:1]="200h" is a median value of the tone data range "000h" to "3FFh", and the detection voltage Vh2 of 10 V is a median value of the data voltage range of 7.5 V to 12.5 V. In other words, if the output voltage VQ matches the detection voltage Vh2 of 10 V when BD10="1", the correct (desired) data voltage is obtained.

As illustrated in FIG. 16A, in the case of "NO" in step S8 for the preliminary setting value CSW[6:1]="1Fh", VQ<Vh2. In this case, it is necessary to raise the output voltage VQ. From Formula FD in FIG. 12B, it can be seen that the output voltage VQ will rise if the capacitance CA of the variable capacitance circuit 30 is reduced, and thus the setting value CSW[6:1] is reduced by "1" at a time. The setting value CSW[6:1] stops at "1Ah", where VQ≥Vh2 for the first time. Through this, the setting value CSW[6:1] at which the output voltage VQ nearest to the detection voltage Vh2 is obtained can be determined.

As illustrated in FIG. 16B, in the case of "YES" in step S8 for the preliminary setting value CSW[6:1]="1Fh", VQ≥Vh2. In this case, it is necessary to lower the output voltage VQ. From Formula FD in FIG. 12B, it can be seen that the output voltage VQ will drop if the capacitance CA of the variable capacitance circuit 30 is increased, and thus the setting value CSW[6:1] is increased by "1" at a time. The setting value CSW[6:1] stops at "24h", where VQ<Vh2 for the first time. Through this, the setting value CSW[6:1] at which the output voltage VQ nearest to the detection voltage Vh2 is obtained can be determined.

The setting value CSW[6:1] obtained through the above processing is determined as the final setting value CSW[6:1], and that setting value CSW[6:1] is written into the register unit 48. When driving the electro-optical panel 200 through capacitive driving, the capacitance of the variable capacitance circuit 30 is set using the setting value CSW[6:1] stored in the register unit 48.

Although this embodiment describes an example in which the setting value CSW[6:1] of the variable capacitance circuit 30 is stored in the register unit 48, the invention is not limited thereto. For example, the setting value CSW[6:1] may be stored in a memory such as a RAM or the like, or the setting value CSW[6:1] may be set using a fuse (for example, setting the setting value through cutting by a laser or the like during manufacture).

9. Phase Expansion Driving Method

Next, a method of driving the electro-optical panel 200 will be described. The following describes an example of phase expansion driving, but the method of driving carried out by the driver 100 in this embodiment is not limited to phase expansion driving.

Figure 17:
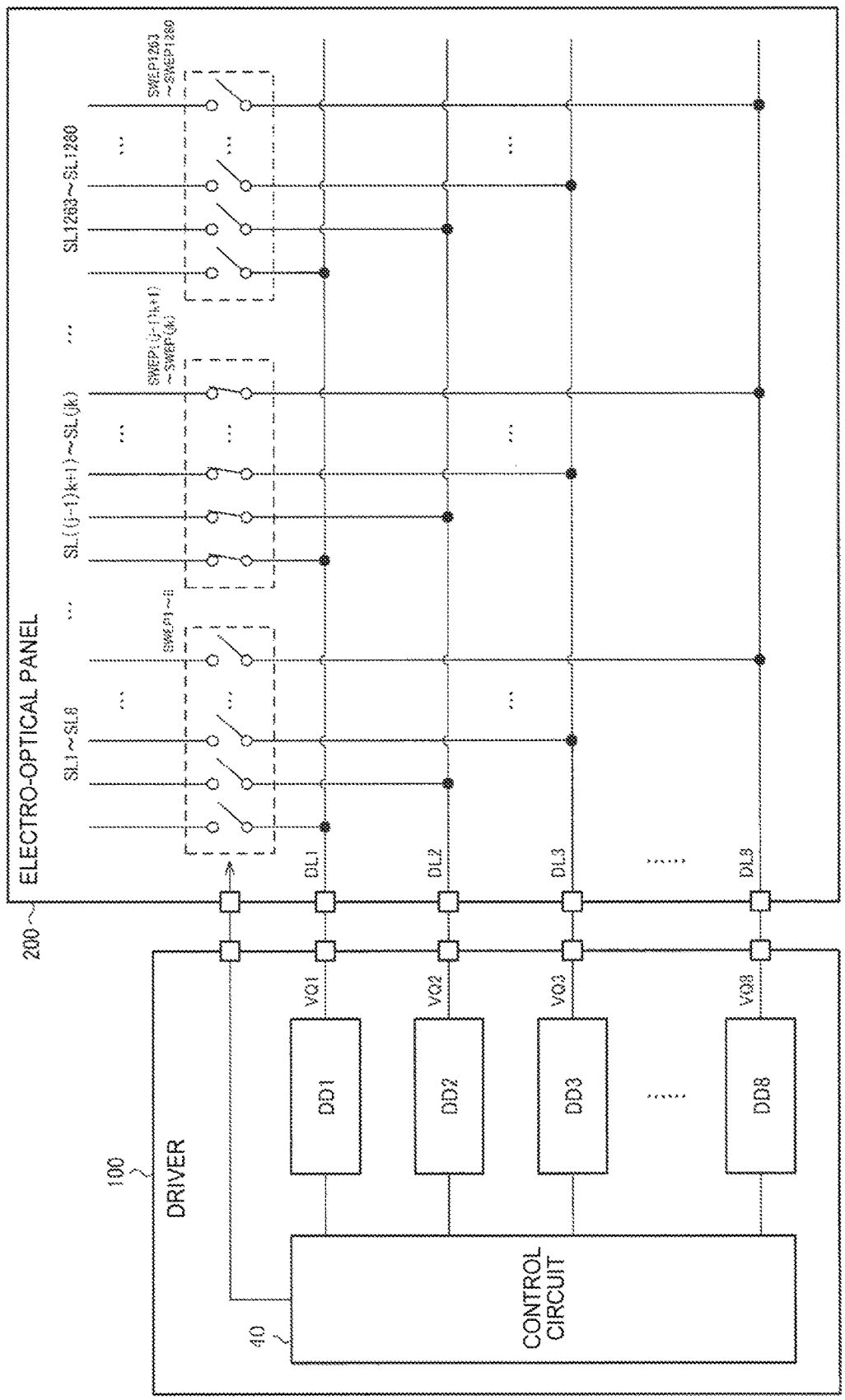
FIG. 17 illustrates a second example of the detailed configuration of a driver, an example of the detailed configuration of an electro-optical panel, and an example of the configuration of connections between the driver and the electro-optical panel.

FIG. 17 illustrates a second example of the detailed configuration of a driver, an example of the detailed configuration of an electro-optical panel, and an example of the configuration of connections between the driver and the electro-optical panel.

The driver 100 includes the control circuit 40 and first to kth data line driving circuits DD1 to DDk (where k is a natural number of 2 or more). The data line driving circuits DD1 to DDk each correspond to the data line driving circuit 110 illustrated in FIG. 13. Note that the following will describe an example in which k=8.

The control circuit 40 outputs corresponding tone data to each of the data line driving circuits DD1 to DD8. The control circuit 40 also outputs a control signal (for example, ENBX illustrated in FIG. 18 or the like) to the electro-optical panel 200.

The data line driving circuits DD1 to DD8 convert the tone data into data voltages, and output those data voltages to the data lines DL1 to DL8 of the electro-optical panel 200 as output voltages VQ1 to VQ8.

The electro-optical panel 200 includes the data lines DL1 to DL8 (first to kth data lines), switching elements SWEP1 to SWEP(tk), and source lines SL1 to SL(tk). t is a natural number of 2 or more, and the following will describe an example in which t=160 (in other words, tk=160×8=1,280 (WXGA)).

Of the switching elements SWEP1 to SWEP1280, one end of each of the switching elements SWEP((j−1)×k+1) to SWEP(j×k) is connected to the data lines DL1 to DL8. j is a natural number no greater than t, which is 160. For example, in the case where j=1, the switching elements are SWEP1 to SWEP8.

The switching elements SWEP1 to SWEP1280 are constituted of TFTs (Thin Film Transistors) or the like, for example, and are controlled based on control signals from the driver 100. For example, the electro-optical panel 200 includes a switching control circuit (not shown), and that switching control circuit controls the switching elements SWEP1 to SWEP1280 to turn on and off based on a control signal such as ENBX.

Figure 18:
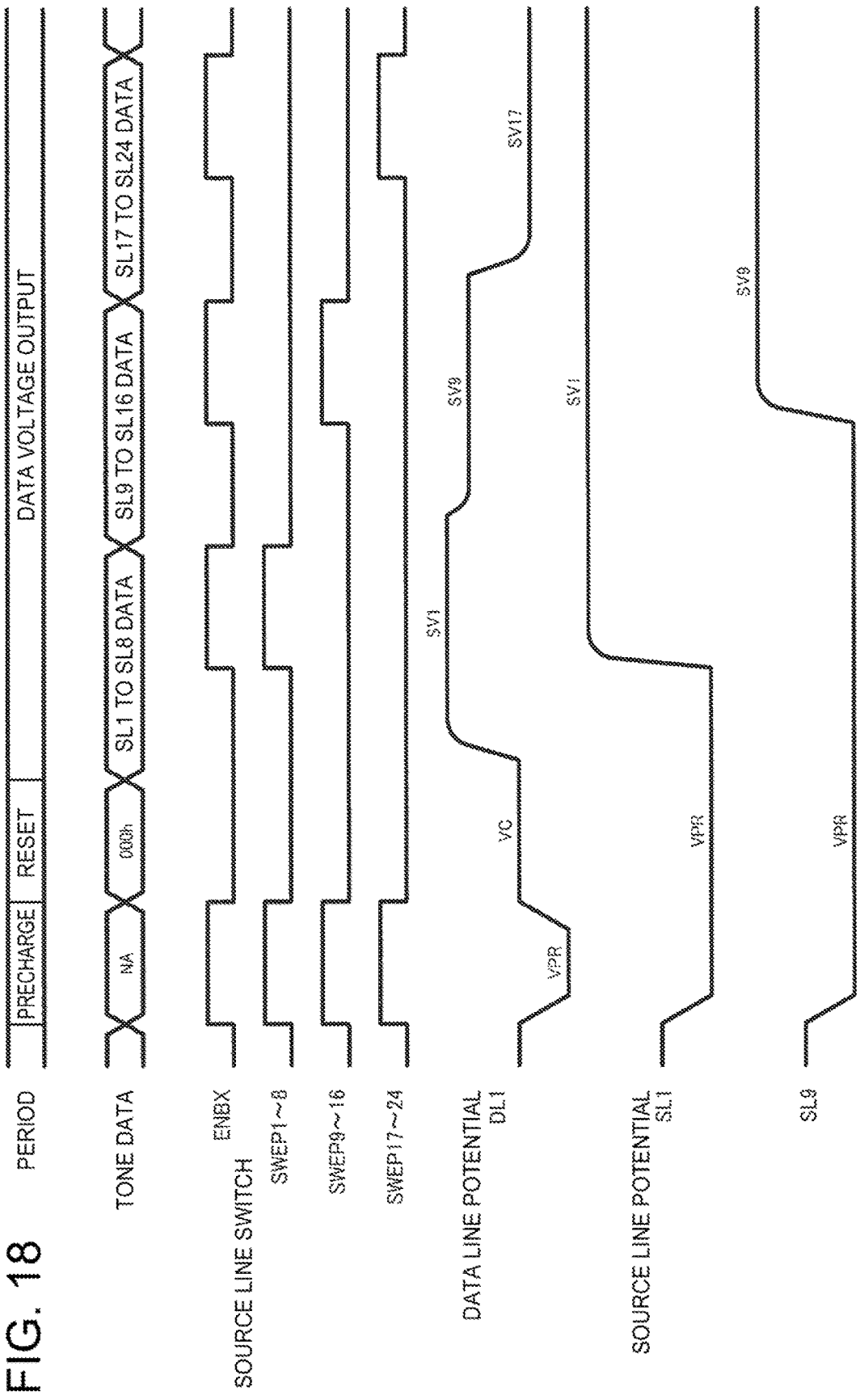
FIG. 18 is an operational timing chart of a driver and an electro-optical panel.

FIG. 18 is an operational timing chart of the driver 100 and the electro-optical panel 200 illustrated in FIG. 17.

In a precharge period, the signal ENBX goes to high-level, and all of the switching elements SWEP1 to SWEP1280 turn on. Then, all of the source lines SL1 to SL1280 are set to a precharge voltage VPR.

In a reset period, the signal ENBX goes to low-level, and the switching elements SWEP1 to SWEP1280 all turn off. The data lines DL1 to DL8 are then set to the reset voltage VC of 7.5 V. The source lines SL1 to SL1280 remain at the precharge voltage VPR.

In a first output period in a data voltage output period, the tone data corresponding to the source lines SL1 to SL8 are inputted into the data line driving circuits DD1 to DD8. Then, capacitive driving is carried out by the capacitor circuit 10 and the capacitor driving circuit 20 and voltage driving is carried out by a voltage driving circuit 80, and the data lines DL1 to DL8 are driven by data voltages SV1 to SV8. After the capacitive driving and voltage driving start, the signal ENBX goes to high-level, and the switching elements SWEP1 to SWEP8 turn on. Then, the source lines SL1 to SL8 are driven by the data voltages SV1 to SV8. At this time, a single gate line (horizontal scanning line) is selected by a gate driver (not shown), and the data voltages SV1 to SV8 are written into the pixel circuits connected to the selected gate line and the data lines DL1 to DL8. Note that FIG. 18 illustrates potentials of the data line DL1 and the source line SL1 as examples.

In a second output period, the tone data corresponding to the source lines SL9 to SL16 are inputted into the data line driving circuits DD1 to DD8. Then, capacitive driving is carried out by the capacitor circuit 10 and the capacitor driving circuit 20 and voltage driving is carried out by the voltage driving circuit 80, and the data lines DL1 to DL8 are driven by data voltages SV9 to SV16. After the capacitive driving and voltage driving start, the signal ENBX goes to high-level, and the switching elements SWEP9 to SWEP16 turn on. Then, the source lines SL9 to SL16 are driven by the data voltages SV9 to SV16. At this time, the data voltages SV9 to SV16 are written into the pixel circuits connected to the selected gate line and the data lines DL9 to DL16. Note that FIG. 20 illustrates potentials of the data line DL1 and the source line SL9 as examples.

Thereafter, the source lines SL17 to SL24, SL25 to SL32, . . . , and SL1263 to SL1280 are driven in the same manner in a third output period, a fourth output period, . . . , and a 160th output period, after which the process moves to the postcharge period.

10. Electronic Device

Figure 19:
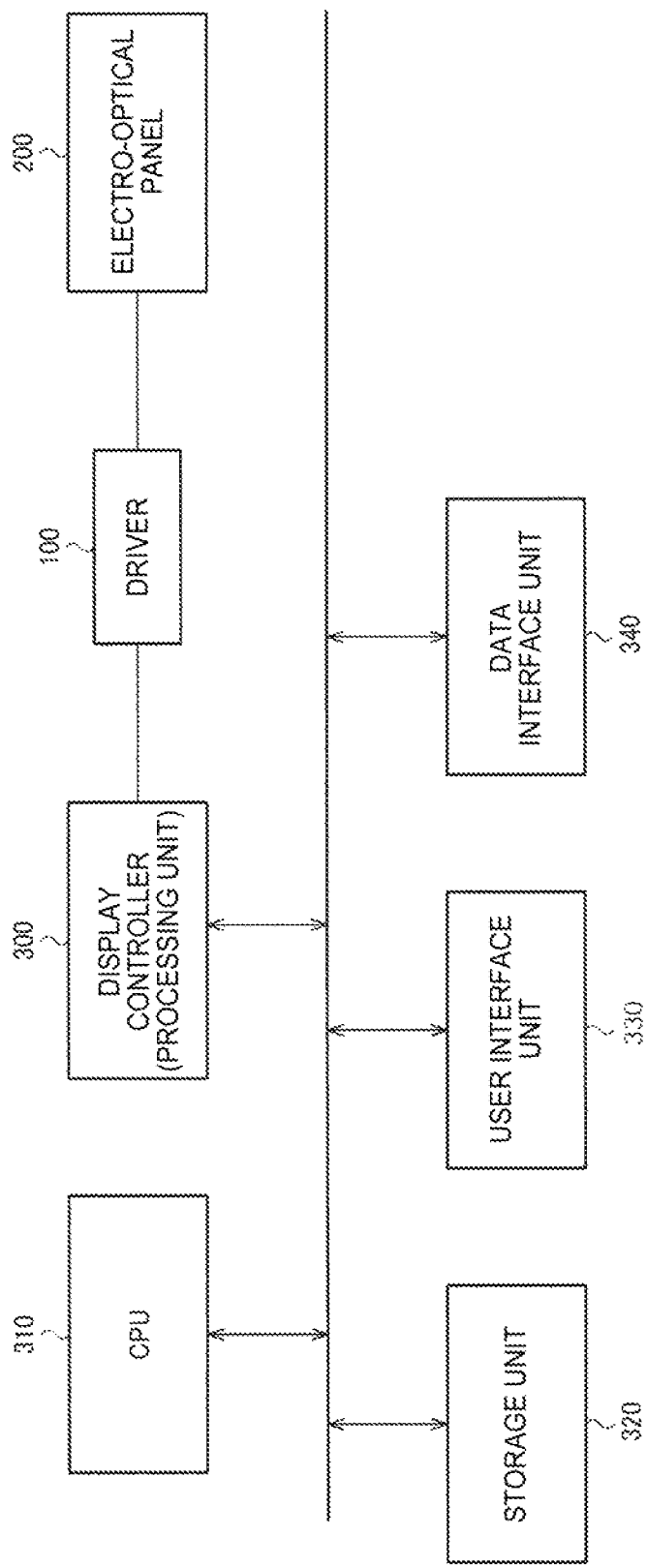
FIG. 19 illustrates an example of the configuration of an electronic device.

FIG. 19 illustrates an example of the configuration of an electronic device in which the driver 100 according to this embodiment can be applied. A variety of electronic devices provided with display devices can be considered as the electronic device according to this embodiment, including projector, a television device, an information processing apparatus (a computer), a mobile information terminal, a car navigation system, a mobile gaming terminal, and so on, for example.

The electronic device illustrated in FIG. 19 includes the driver 100, the electro-optical panel 200, the display controller 300 (a first processing unit), a CPU 310 (a second processing unit), a storage unit 320, a user interface unit 330, and a data interface unit 340.

The electro-optical panel 200 is a matrix-type liquid-crystal display panel, for example. Alternatively, the electro-optical panel 200 may be an EL (Electro-Luminescence) display panel using selfluminous elements. The user interface unit 330 is an interface unit that accepts various operations from a user. The user interface unit 330 is constituted of buttons, a mouse, a keyboard, a touch panel with which the electro-optical panel 200 is equipped, or the like, for example. The data interface unit 340 is an interface unit that inputs and outputs image data, control data, and the like. For example, the data interface unit 340 is a wired communication interface such as USB, a wireless communication interface such as a wireless LAN, or the like. The storage unit 320 stores image data inputted from the data interface unit 340. Alternatively, the storage unit 320 functions as a working memory for the CPU 310, the display controller 300, or the like. The CPU 310 carries out control processing for the various units in the electronic device, various types of data processing, and so on. The display controller 300 carries out control processing for the driver 100. For example, the display controller 300 converts image data transferred from the data interface unit 340, the storage unit 320, or the like into a format that can be handled by the driver 100, and outputs the converted image data to the driver 100. The driver 100 drives the electro-optical panel 200 based on the image data transferred from the display controller 300.

Although the foregoing has described embodiments of the invention in detail, one skilled in the art will easily recognize that many variations can be made thereon without departing from the essential spirit of the novel items and effects of the invention. Such variations should therefore be taken as being included within the scope of the invention. For example, in the specification or drawings, terms denoted at least once along with terms that have broader or the same definitions as those terms ("low-level" and "high-level" for "first logic level" and "second logic level", respectively) can be replaced with those terms in all areas of the specification or drawings. Furthermore, all combinations of the embodiments and variations fall within the scope of the invention. Finally, the configurations and operations of the capacitor circuit, capacitor driving circuit, variable capacitance circuit, detection circuit, control circuit, driver, electro•optical panel, electronic device are not limited to those described in the embodiments, and many variations can be made thereon.

The entire disclosure of Japanese Patent Application No. 2014-246531, filed Dec. 5, 2014 is expressly incorporated by reference herein.

What is claimed is:

1. A driver comprising:
  a capacitor driving circuit that outputs first to nth capacitor driving voltages (where n is a natural number of 2 or more) corresponding to tone data to first to nth capacitor driving nodes; and
  a capacitor circuit including first to nth capacitors provided between the first to nth capacitor driving nodes and a data voltage output terminal,
  wherein the capacitor driving circuit includes first to nth driving units that output the first to nth capacitor driving voltages; and
  in the case where a capacitance of the nth capacitor is the highest among the first to nth capacitors, at least the nth driving unit of the first to nth driving units is a driving unit whose driving capability is variable, and
  in the case where driving capabilities of the first to nth driving units are represented by D1 to Dn and capacitances of the first to nth capacitors are represented by C1 to Cn, the driving capability Dn of the nth driving unit is set so that $Dn/Cn < D1/C1$.

2. The driver according to claim 1, further comprising:
  a storage unit that stores a setting value for the driving capability of the driving unit whose driving capability is variable.

3. An electronic device comprising the driver according to claim 2.

4. The driver according to claim 1,
  wherein jth to nth driving units of the first to nth driving units (where j is a natural number of $1 \leq j \leq n$) are driving units whose driving capabilities are variable; and
  first to j−1th driving units of the first to nth driving units are driving units whose driving capabilities are fixed.

5. The driver according to claim 4,
  wherein in the case where driving capabilities of the first to nth driving units are represented by D1 to Dn and capacitances of the first to nth capacitors are represented by C1 to Cn, the driving capabilities of the jth to nth driving units are set so that $Di/Ci < D1/C1$ (where i is a natural number of $j \leq i \leq n$).

6. An electronic device comprising the driver according to claim 5.

7. The driver according to claim 4, further comprising:
  a storage unit that stores a setting value for the driving capability of the driving unit whose driving capability is variable.

8. An electronic device comprising the driver according to claim 7.

9. An electronic device comprising the driver according to claim 4.

10. The driver according to claim 1, further comprising:
  a variable capacitance circuit provided between the data voltage output terminal and a reference voltage node,
  wherein a capacitance of the variable capacitance circuit is set so that a capacitance obtained by adding a capacitance of the variable capacitance circuit and an electro-optical panel-side capacitance is in a prescribed capacitance ratio relationship with a capacitance of the capacitor circuit.

11. An electronic device comprising the driver according to claim 10.

12. An electronic device comprising the driver according to claim 1.

* * * * *